US012642038B2

(12) United States Patent
Wen

(10) Patent No.: US 12,642,038 B2
(45) Date of Patent: May 26, 2026

(54) SEMICONDUCTOR EDGE PROCESSING APPARATUS AND METHODS

(71) Applicant: Huaying Research Co., Ltd., New District Wuxi (CN)

(72) Inventor: Sophia Ziying Wen, Wuxi (CN)

(73) Assignee: Huaying Research Co., Ltd., Wuxi (CN)

( * ) Notice: Subject to any disclaimer, the term of this patent is extended or adjusted under 35 U.S.C. 154(b) by 659 days.

(21) Appl. No.: 17/915,523

(22) PCT Filed: Sep. 14, 2021

(86) PCT No.: PCT/CN2021/118238
§ 371 (c)(1),
(2) Date: Sep. 29, 2022

(87) PCT Pub. No.: WO2022/057790
PCT Pub. Date: Mar. 24, 2022

(65) Prior Publication Data
US 2023/0135250 A1 May 4, 2023

(30) Foreign Application Priority Data
Sep. 15, 2020 (CN) .......................... 202010970751.1

(51) Int. Cl.
*H10P 72/00* (2026.01)
*H10P 72/76* (2026.01)

(52) U.S. Cl.
CPC ...... *H10P 72/0422* (2026.01); *H10P 72/0428* (2026.01); *H10P 72/7611* (2026.01); *H10P 72/7624* (2026.01)

(58) Field of Classification Search
None
See application file for complete search history.

(56) References Cited

U.S. PATENT DOCUMENTS 6,315,832 B1 * 11/2001 Liu ................... H01L 21/67051
210/167.01
6,350,319 B1 * 2/2002 Curtis ............... H01L 21/67017
257/E21.309
(Continued)

FOREIGN PATENT DOCUMENTS

| CN | 201084721 Y | 7/2008 |
| CN | 104916572 A | 9/2015 |
(Continued)

OTHER PUBLICATIONS

Machine Generated English Translation of description ofCN109119366A. Published Jan. 1, 2019. (Year: 2019).*
(Continued)

*Primary Examiner* — Sylvia MacArthur
(74) *Attorney, Agent, or Firm* — Zhong Law, LLC

(57) ABSTRACT

An apparatus for processing an edge surface of a wafer comprises a lower chamber having a first supporting area configured to support the wafer, an upper chamber having a second supporting area, and a first channel formed by the first supporting area, the second supporting area and peripheral areas thereof. The upper chamber is engaged with the lower chamber to position the wafer between the first supporting area and the second supporting area. The first channel is configured to provide a first space to flow one or more chemical fluids for etching an edge area of the wafer. The upper chamber comprises a protrusion part being configured to resist against an outer edge of the wafer in order to align the central axis of the wafer with the central axis of the second supporting area. This disclosure can process the edge of wafers.

18 Claims, 19 Drawing Sheets

(56)  References Cited

U.S. PATENT DOCUMENTS

| | | | |
|---|---|---|---|
| 2004/0253747 A1 | 12/2004 | Wen | |
| 2007/0256710 A1* | 11/2007 | Wen | H01L 21/67086 |
| | | | 134/22.1 |
| 2023/0135250 A1* | 5/2023 | Wen | H01L 21/6708 |
| | | | 156/345.51 |

FOREIGN PATENT DOCUMENTS

| | | | |
|---|---|---|---|
| CN | 105140168 A | 12/2015 | |
| CN | 106971958 A | 7/2017 | |
| CN | 109119366 A | 1/2019 | |
| CN | 109166814 A | 1/2019 | |
| JP | H11330031 A | 11/1999 | |
| JP | 2004083180 A | 3/2004 | |
| JP | 2014112652 A | 6/2014 | |
| JP | 2017092397 A | 5/2017 | |
| WO | 2018/209160 A1 | 11/2018 | |
| WO | WO2020048306 A1 | 3/2020 | |

OTHER PUBLICATIONS

Machine Generated English Translation of claims of CN109119366A. Published Jan. 1, 2019. (Year: 2019).*

Machine Generated English Translation of JP2017092397. Published May 25, 2017. (Year: 2017).*

Extended European Search Report dated Oct. 20, 2023, issued in corresponding European Patent Application No. 21868613.

Huaying Research Co., Ltd., CN202111076005.9 First Office Action Dec. 19, 2024, 12 pgs.

Huaying Research Co., Ltd., JP2022534865, Decision to Grant a Patent, Jul. 24, 2024, 5 pgs.

Huaying Research Co., Ltd., TW111120239, First Office Action, Dec. 23, 2024, 10 pgs.

International Search Report (with partial translation) and Written Opinion dated Nov. 25, 2021, issued in corresponding International Patent Application No. PCT/CN2021/118238.

Huaying Research Co., Ltd., Chinese Office Action, CN Patent Application No. 202111074547.2, Oct. 30, 2024, 19 pgs.

Huaying Research Co., Ltd., European Office Action, EP Patent Application No. 21868613.7, Feb. 27, 2025, 9 pgs.

* cited by examiner

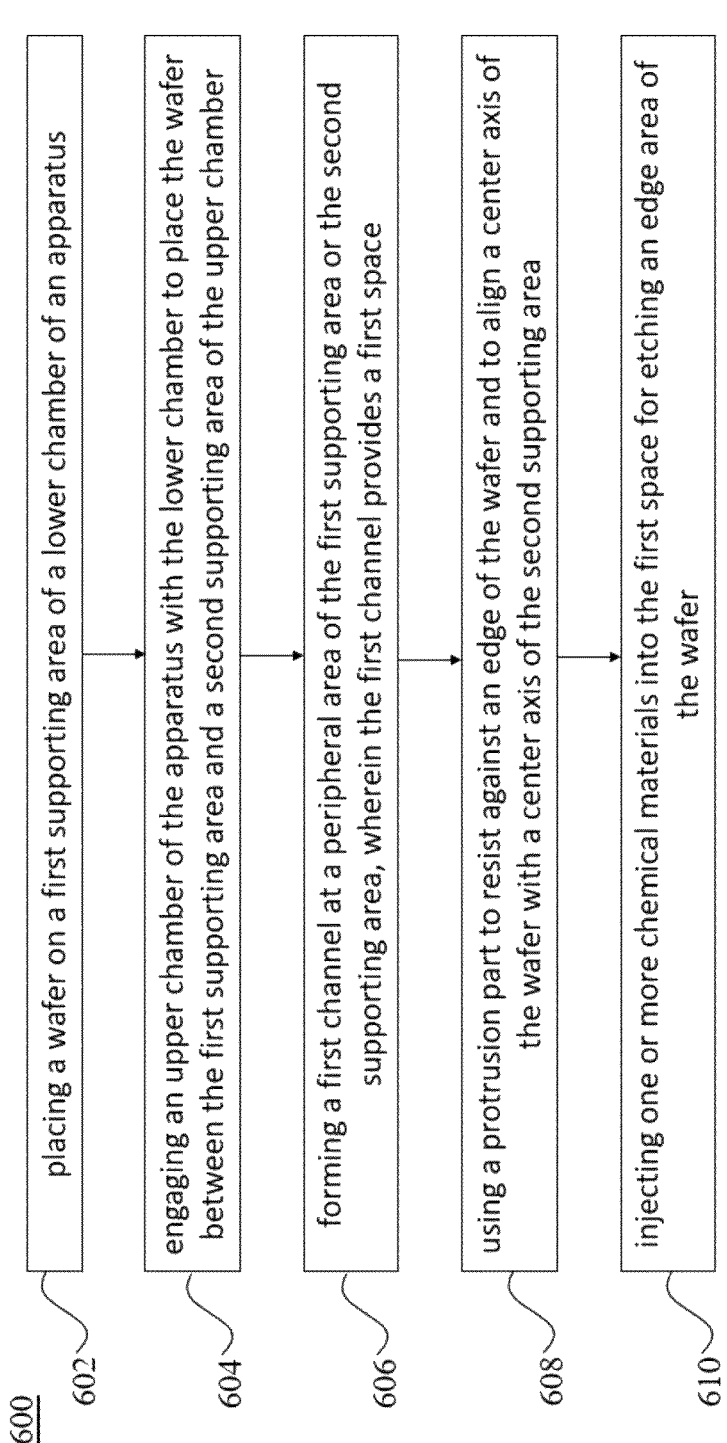

600

602 placing a wafer on a first supporting area of a lower chamber of an apparatus 604 engaging an upper chamber of the apparatus with the lower chamber to place the wafer between the first supporting area and a second supporting area of the upper chamber 606 forming a first channel at a peripheral area of the first supporting area or the second supporting area, wherein the first channel provides a first space 608 using a protrusion part to resist against an edge of the wafer and to align a center axis of the wafer with a center axis of the second supporting area 610 injecting one or more chemical materials into the first space for etching an edge area of the wafer

FIG. 6

SEMICONDUCTOR EDGE PROCESSING APPARATUS AND METHODS

CROSS-REFERENCED APPLICATIONS

This application is a U.S. national phase entry under 35 U.S.C. § 371 from PCT International Application No. PCT/CN2021/118238 filed on Sep. 14, 2021, which is based upon and claims the benefit of priority from the prior Chinese Patent Application No. 202010970751.1 filed on Sep. 15, 2020. The entire contents of the above applications are incorporated herein by reference.

TECHNICAL FIELD

The present disclosure relates to a technical field of processing surfaces of semiconductor wafers or workpieces that are similar to the semiconductor wafers, and in particular, to apparatus and methods for processing edges of semiconductors.

BACKGROUND

During the semiconductor fabrication, semiconductor wafers are subjected to a series of processes to meet the demanding requirements of the semiconductor industries. In the advanced semiconductor manufacture, it is desirable to have the wafer edges that are uniform, smooth, damage-free, and polished. There are challenges to obtain an uniform and precisely etched wafer edge with the demanding requirements.

FIG. 1A illustrates a top view of a schematic diagram of a semiconductor wafer 100. Semiconductor wafer 100 comprises a substrate 101 and a thin layer 102 deposited on the top of the substrate 101. FIG. 1B illustrates a cross-section view of semiconductor wafer 100 along a direction of A-A. The measurement points 1-8 are measuring positions related to the semiconductor wafer in the processing operations. The etched width refers to the difference between the radius of the substrate layer 101 and the thin layer 102, as illustrated in FIG. 1B. The etched width shall be substantially the same at each of the measurement points 1-8. The smaller the difference between the maximum and minimum etching widths, the higher the uniformity. For example, when the edged width is designed for 0.7 mm, a difference between a maximum etched width and a minimum etched width shall not be more than 0.1 mm, otherwise resulting in an un-even and/or a non-uniform etching width. The difference between the maximum etched width and the minimum etched width, if exceeding 0.1 mm, will directly affect the quality of subsequent processing operations and eventually may cause poor performance of integrated circuit chips, affecting chip manufacturing yield rates.

The wet processes of semiconductor wafer has the advantages of simple process mechanism, flexible application and low cost. There are several conventional wet process methods to etch the edge of semiconductor wafer. For example, a method of polishing the edge area of the semiconductor wafer has been adopted to wafer edge etching. It rotates the semiconductor wafer and utilizes physical friction and chemical gas or liquid erosion to remove a thin layer of materials from the substrate layer. The polishing method, however, is mainly used in the manufacturing process of semiconductor wafer with less accuracy requirement because it is prone to damage the retained thin layer as well as the substrate layer. The damaged edges may cause the thin layer edge peeling during thermal process of the wafer and eventually cause the wafer discarded. There is a method of sucking the semiconductor wafer with a vacuum disc. It uses a vacuum disc to suck the semiconductor wafer where most of the thin layer is designed to be retained within the disc, only the to-be-removed part of the thin layer exposing outside the vacuum disc, and then immerses the vacuum disc with the semiconductor wafer entirely in a chemical etching solution to etch away the exposed thin layer. The vacuum disc method, however, may results an unsmooth removal of the thin layer and uneven etched widths. Another commonly used method is the filming protection method, which uses pure chemical resistant materials such as PTFE, PE and other plastic films to attach to the top of the thin layer that needs to be retained, leaving the to-be-removed area uncovered, and then exposes the whole wafer to a chemically corrosive gas environment or soaks in a chemical etching solution to etch away the exposed area. The filming protection method often results uneven etching widths because the center of the pre-cut film may not be aligned with the center of the wafer substrate accurately. The filming protection method involved several processing steps and a variety of devices, including the devices for film attaching, wet etching, rinsing, and film removal. There is another new method which uses a special nozzle to precisely spray the chemical fluids on the edge of a rotating wafer to etch away the to-be-removed thin layer to achieve uniform, smooth and damage-free etching. The method can achieve higher etching effect, but it has extremely high requirements on the design of the equipment and processing accuracy of the components in harsh process condition, resulting in high costs of process and equipment.

Thus, it would be desirable to develop apparatus of processing the semiconductor wafer edges that take into account and overcome at least some of the issues discussed above, as well as other possible issues.

SUMMARY OF THE DISCLOSURE

The present disclosure is intended to provide an apparatus, system and method of processing semiconductor, so as to resolve the issues currently existing and to realize the accurate process of semiconductor wafer edges.

Exemplary implementations of the present disclosure are directed to an apparatus with a first channel to provide a first space to flow one or more chemical fluids for etching an edge area of a wafer and a protrusion part to align a center of the wafer with a center of the apparatus by resisting against the outer edge of wafer.

Exemplary implementations of the present disclosure are also directed to a system comprising the apparatus for processing the edge area of a wafer and a material storage apparatus.

Exemplary implementations of the present disclosure are further directed to a method comprising forming the first channel to flow one or more chemical fluids and using the protrusion part to contact an outer edge of a wafer so as to align the center of the wafer with a center of a supporting area.

The exemplary implementations of the present disclosure can be used in processing of wafers, including the semiconductor wafer, to etch the wafer edge surface evenly and precisely.

Exemplary implementations of this disclosure can provide multiple advantages over existing solutions. It can improve the accuracy and uniformity of etching edge surface of the wafer by using a protrusion part and can achieve a smooth surface of the substrate layer of wafer by selecting right chemical etching fluids, controlling the fluid flow rate and the time of contacting wafer edge, that facilitate the subsequent process operations of the wafer. It can save time and cost of the processing operations. It can process the wafer edge surface with more accuracy, including the accurate selection of an edge surface area to be treated and etched.

The present disclosure thus includes, without limitation, the following exemplary implementations.

Some exemplary implementations provide an apparatus, comprising a lower chamber having a first supporting area configured to support a wafer, and an upper chamber having a second supporting area. The upper chamber is engaged with the lower chamber to place the wafer between the first supporting area and the second supporting area. A first channel formed at a peripheral area of the first supporting area or the second supporting area. The first channel is configured to provide a first space to flow one or more chemical fluids for etching an edge area of the wafer. The upper chamber comprises a protrusion part being configured to resist against an edge of the wafer and to align a center axis of the wafer with a center axis of the second supporting area.

In some exemplary implementations or any combination of preceding exemplary implementations of the apparatus, the protrusion part is adjacent to the second supporting area and extends toward the lower chamber, the center axis of the wafer being perpendicular to an upper surface of the wafer, the center axis of the second supporting area being perpendicular to a lower surface of the upper chamber, and the upper surface of the wafer being parallel to the lower surface of the second supporting area.

In some exemplary implementations or any combination of preceding exemplary implementations of the apparatus, the protrusion part includes a closed loop arranged around the wafer, and the protrusion part is configured to uniformly resist against the edge area of the wafer so that the center axis of the wafer overlaps with the center axis of the second supporting area.

In some exemplary implementations or any combination of preceding exemplary implementations of the apparatus, the protrusion part includes a plurality of juts being circularly and evenly arranged around the outer edge of wafer to uniformly resist against the outer edge area of the wafer.

In some exemplary implementations or any combination of preceding exemplary implementations of the apparatus, the protrusion part includes an inner surface inclining at an angle to the center axis of the second supporting area, the inner surface being configured to resist against the outer edge area of the wafer.

In some exemplary implementations or any combination of preceding exemplary implementations of the apparatus, the protrusion part includes a corner facing towards the center axis of the second supporting area, the corner being configured to resist against the outer edge area of the wafer.

In some exemplary implementations or any combination of preceding exemplary implementations of the apparatus, a first groove is formed at a peripheral area of the lower chamber and configured to provide a first groove space to flow one or more chemical fluids, and wherein a passage is formed between the upper chamber and the lower chamber, the passage connecting the first space with the first groove space for facilitating the one or more chemical fluids flow from the first space to the first groove space via the passage.

In some exemplary implementations or any combination of preceding exemplary implementations of the apparatus, wherein a second groove is formed at a peripheral area of the upper chamber and positioned above the first groove.

In some exemplary implementations or any combination of preceding exemplary implementations of the apparatus, an elastic component is placed between the first groove and the second groove, the elastic component being configured to block the one or more chemical fluids from flowing from the first space to the first groove space.

In some exemplary implementations or any combination of preceding exemplary implementations of the apparatus, the elastic component is O-ring.

In some exemplary implementations or any combination of preceding exemplary implementations of the apparatus, the first channel is formed at the peripheral area of the second supporting area, and wherein the upper chamber comprises a first through hole configured to facilitate the one or more chemical fluids to flow between the first space and an outside of the apparatus.

In some exemplary implementations or any combination of preceding exemplary implementations of the apparatus, a second channel is formed at the peripheral area of the first supporting area and configured to provide a second space to flow the one or more chemical fluids for etching the edge area of the wafer.

In some exemplary implementations or any combination of preceding exemplary implementations of the apparatus, the lower chamber comprises a second through hole configured to facilitate the one or more chemical fluids to flow between the second space and the outside of the apparatus.

In some exemplary implementations or any combination of preceding exemplary implementations of the apparatus, the first channel is formed at or by the peripheral area of the first supporting area, and a first through hole is configured to facilitate the one or more chemical fluids to flow between the first space and an outside of the apparatus.

Some exemplary implementations provide a system comprising a processing apparatus and a material storage apparatus connected to the processing apparatus. The apparatus comprises a lower chamber having a first supporting area configured to support a wafer, an upper chamber having a second supporting area, and a first channel formed at or by a peripheral area of the first supporting area or the second supporting area. The upper chamber is engaged with the lower chamber to place the wafer between the first supporting area and the second supporting area. The first channel is configured to provide a first space to flow one or more chemical fluids for etching an edge area of the wafer. The upper chamber comprises a protrusion part being configured to resist against an edge of the wafer and to align a center axis of the wafer with a center axis of the second supporting area. The material storage apparatus is configured to store the one or more chemical fluids and provide or collect the one or more chemical fluids from the processing apparatus.

Some exemplary implementations provide a method comprising: placing a wafer on a first supporting area of a lower chamber of an apparatus, engaging an upper chamber of the apparatus with the lower chamber, using a protrusion part to resist against an edge of the wafer and to align a center axis of the wafer with a center axis of the second supporting area, placing the wafer between the first supporting area and a second supporting area, forming a first channel at a peripheral area of the first supporting area or the second supporting area which provides a first space, and injecting one or more chemical fluids into the first space for etching an edge area of the wafer.

These and other features, aspects, and advantages of the present disclosure will be apparent from a reading of the following detailed description together with the accompanying figures, which are briefly described below. The present disclosure includes any combination of one or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and exemplary implementations, should be viewed as combinable unless the context of the disclosure clearly dictates otherwise.

It will therefore be appreciated that this Summary is provided merely for purposes of summarizing some exemplary implementations so as to provide a basic understanding of some aspects of the disclosure. Accordingly, it will be appreciated that the above described exemplary implementations are merely examples and should not be construed to narrow the scope or spirit of the disclosure in any way. Other example implementations, aspects, and advantages will become apparent from the following detailed description taken in conjunction with the accompanying figures which illustrate, by way of example, the principles of some described exemplary implementations.

BRIEF DESCRIPTION OF THE DRAWINGS

Figures 1A, 1B:
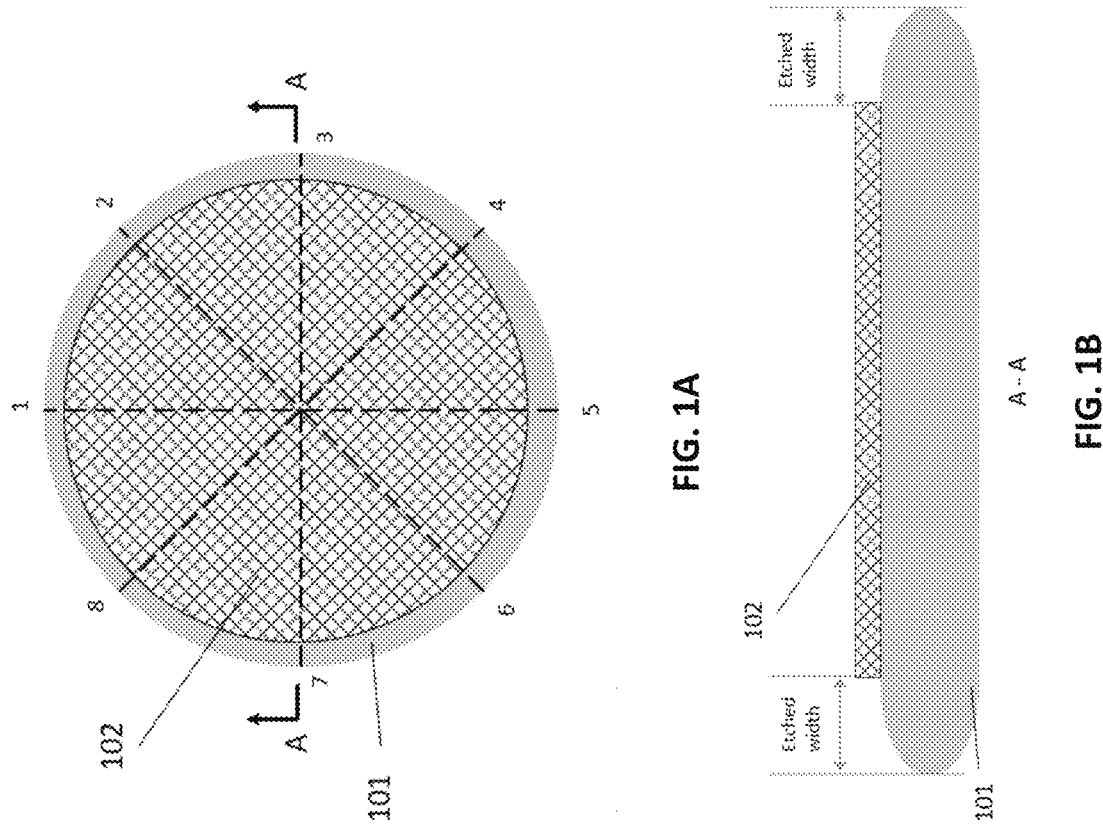

Having thus described exemplary implementations of the disclosure in general terms, reference will now be made to the accompanying figures, which are not necessarily drawn to scale, and wherein:

FIG. 1A illustrates a top view of a schematic diagram of a semiconductor wafer.

FIG. 1B illustrates a cross-section view of the semiconductor wafer along a direction A-A of FIG. 1A.

Figure 2A:
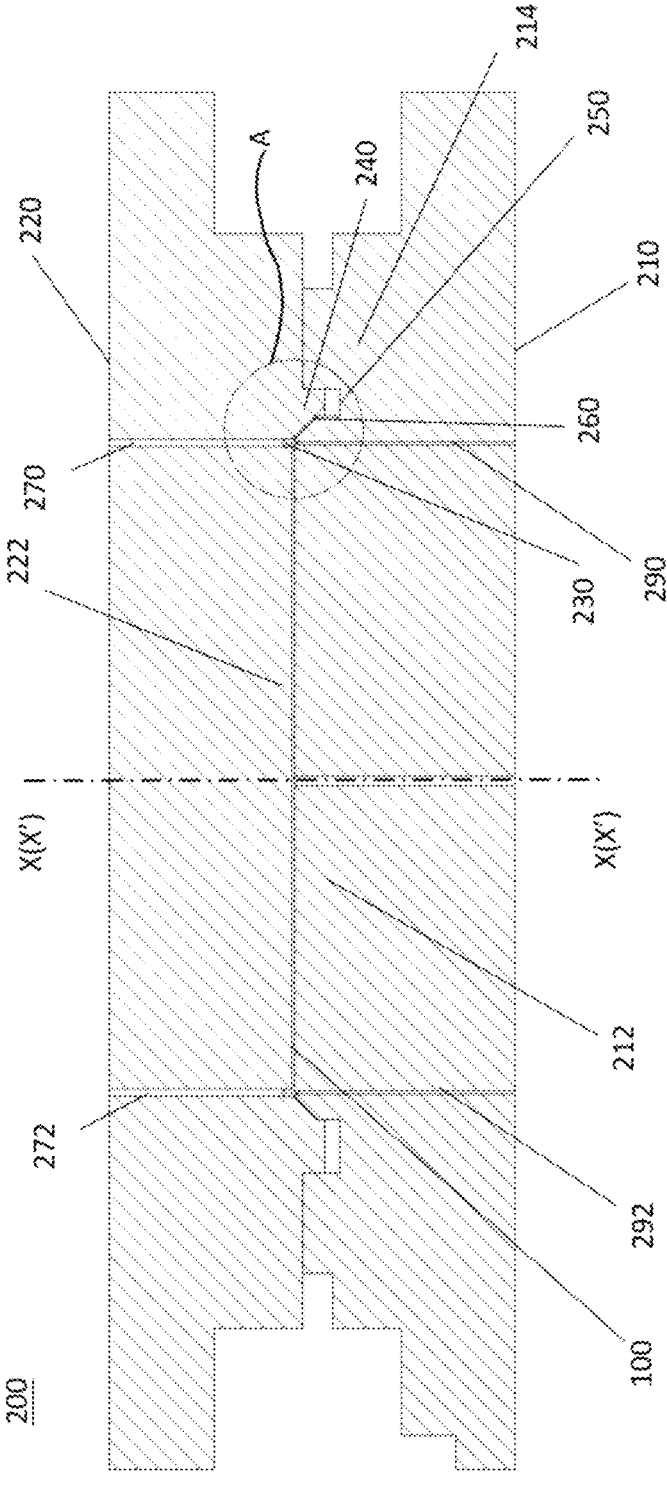
Figure 2B:
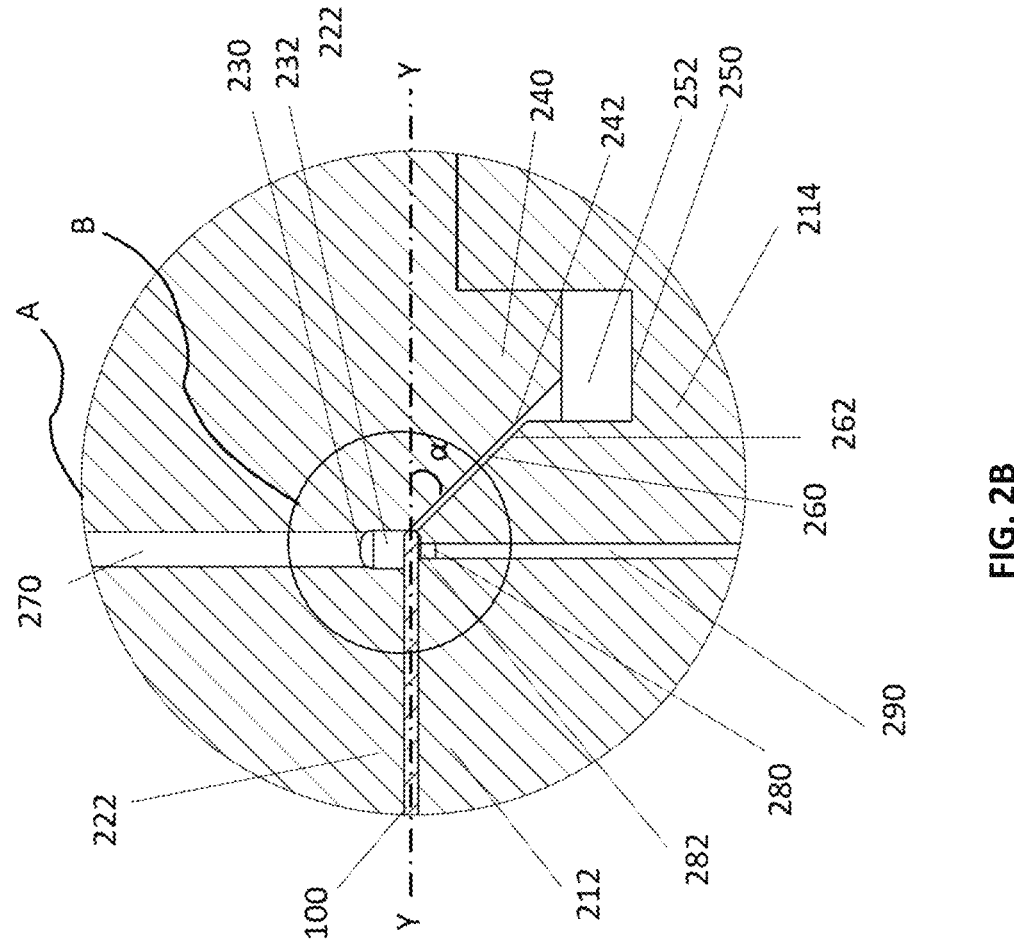

FIG. 2A illustrates a cross-section view of an exemplary apparatus 200, according to exemplary implementations of the present disclosure FIG. 2B illustrates a detailed view of a circle A shown in FIG. 2A, according to exemplary implementations of the present disclosure.

Figure 2C:
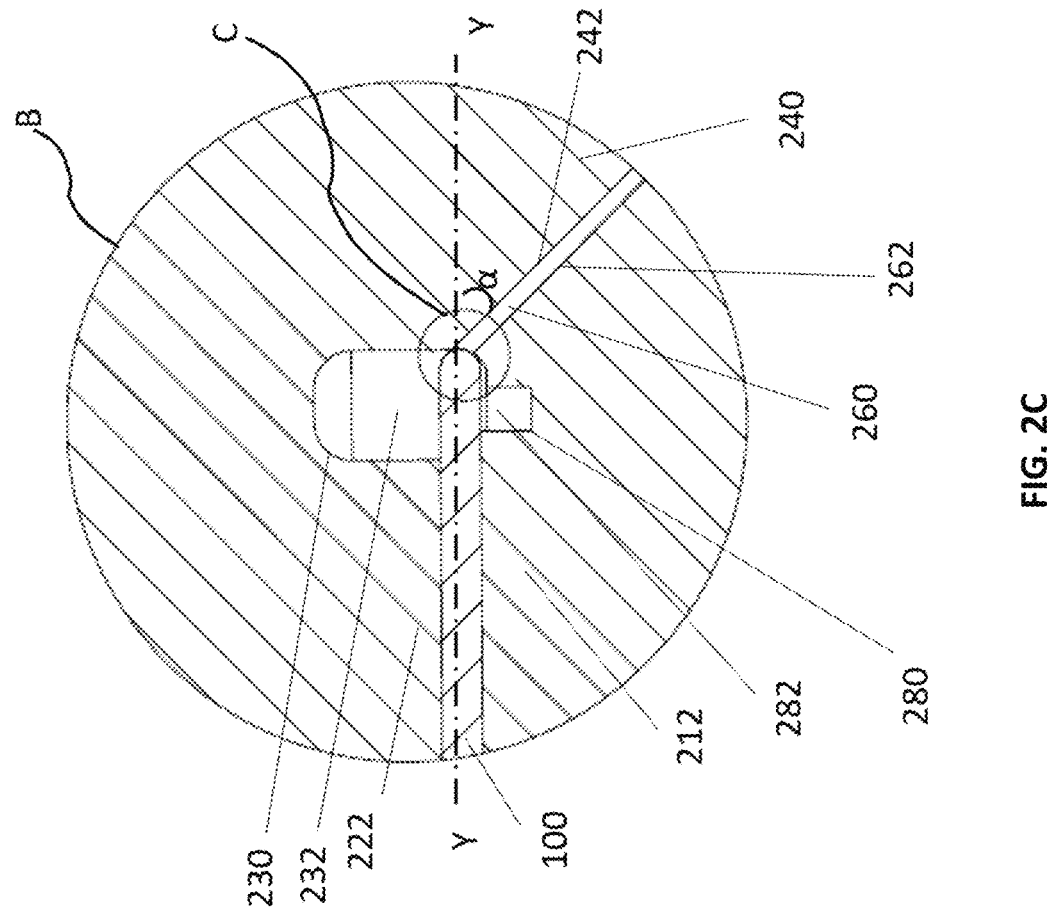

FIG. 2C illustrates a detailed view of a circle B shown in FIG. 2B, according to exemplary implementations of the present disclosure.

Figure 2D:
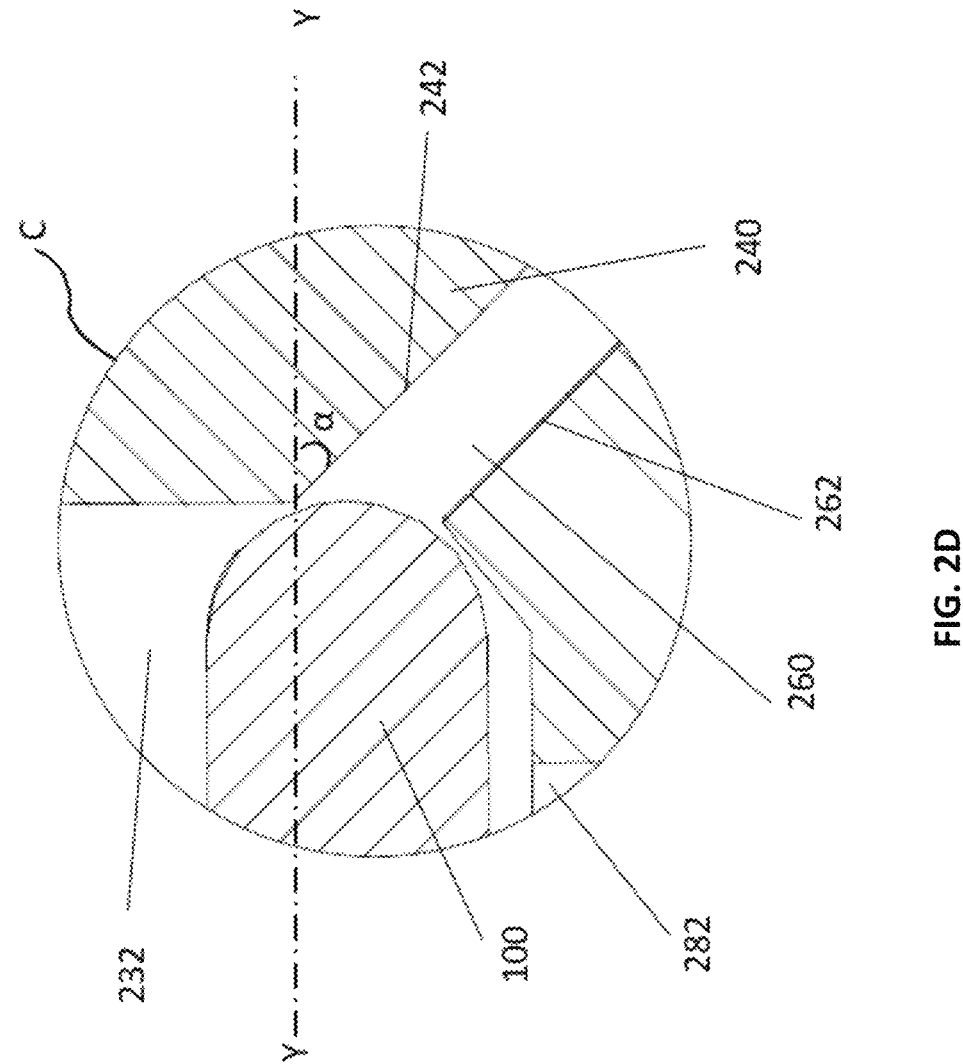

FIG. 2D illustrates a detailed view of a circle C shown in FIG. 2C, according to exemplary implementations of the present disclosure.

Figure 2E:
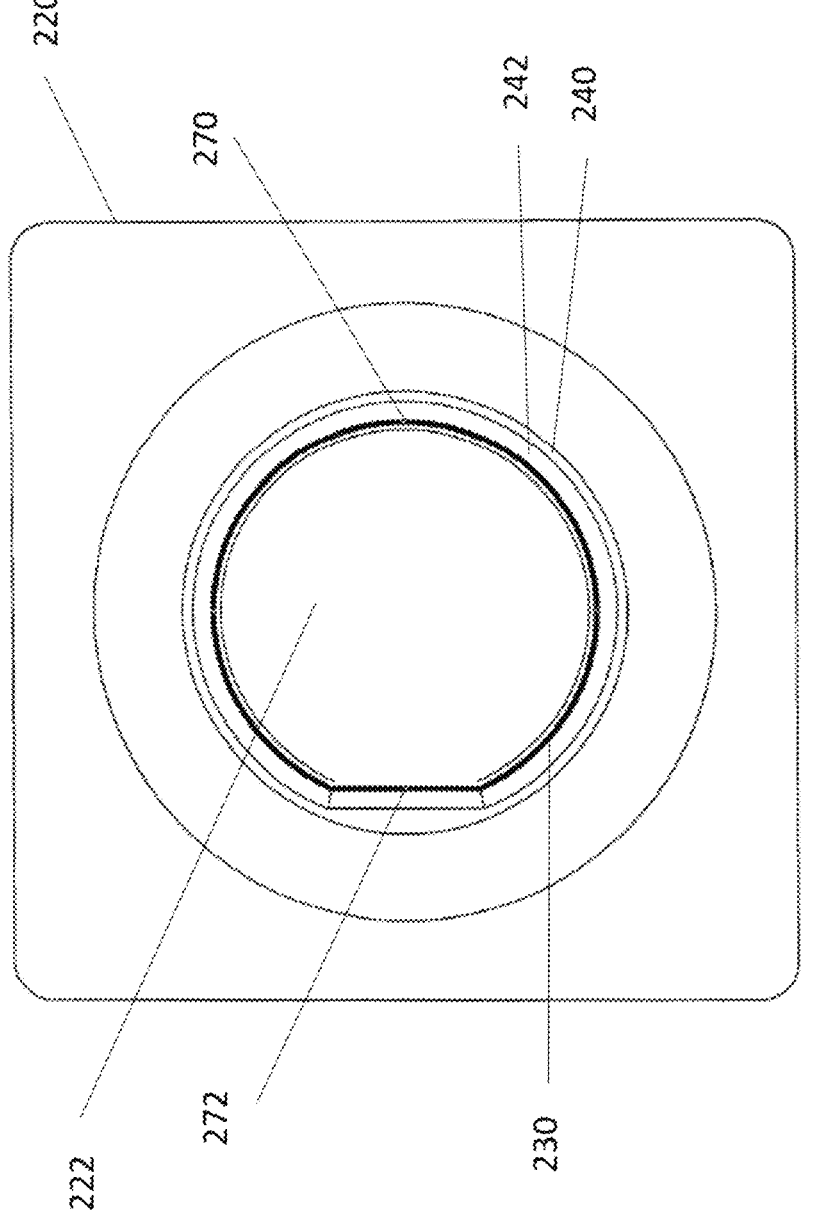

FIG. 2E illustrates a bottom view of an upper chamber 220 of exemplary apparatus 200 shown in FIG. 2A, according to exemplary implementations of the present disclosure.

Figure 2F:
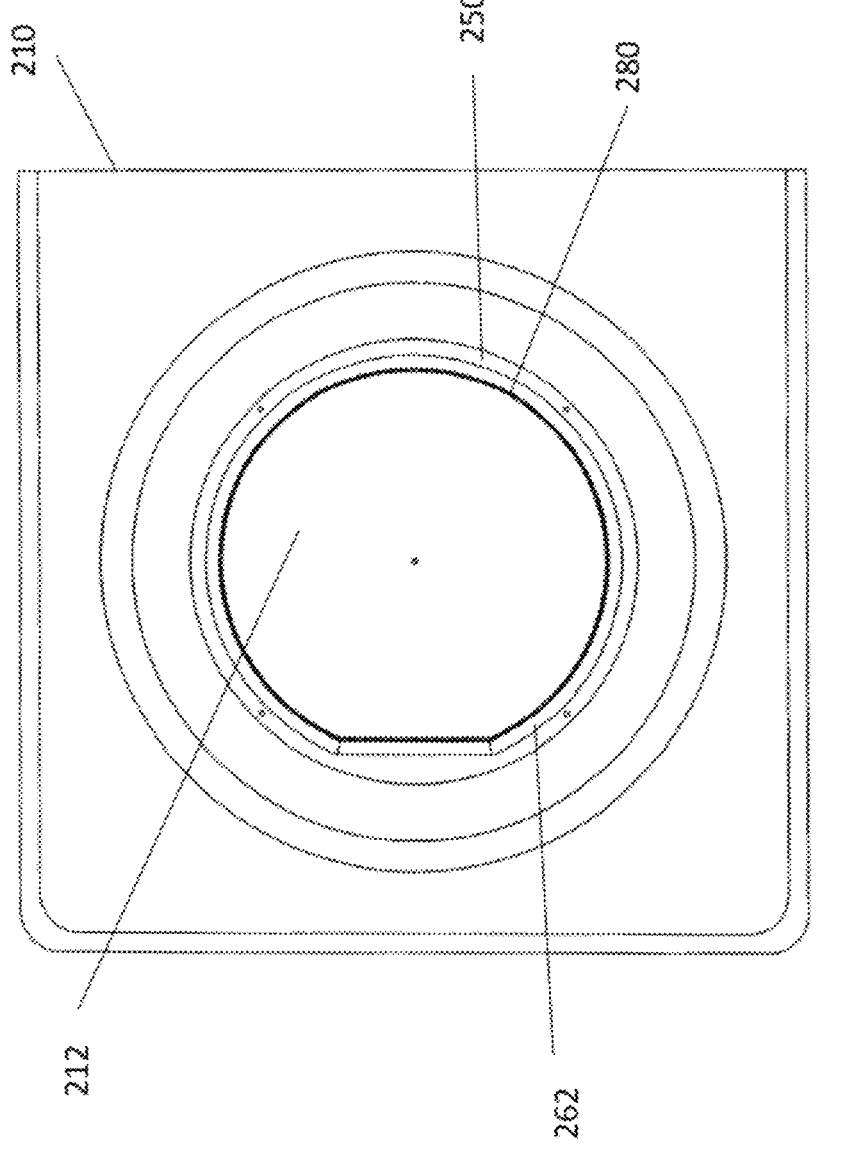

FIG. 2F illustrates a top view of a lower chamber 210 of exemplary apparatus 200 shown in FIG. 2A, according to exemplary implementations of the present disclosure.

Figure 3A:
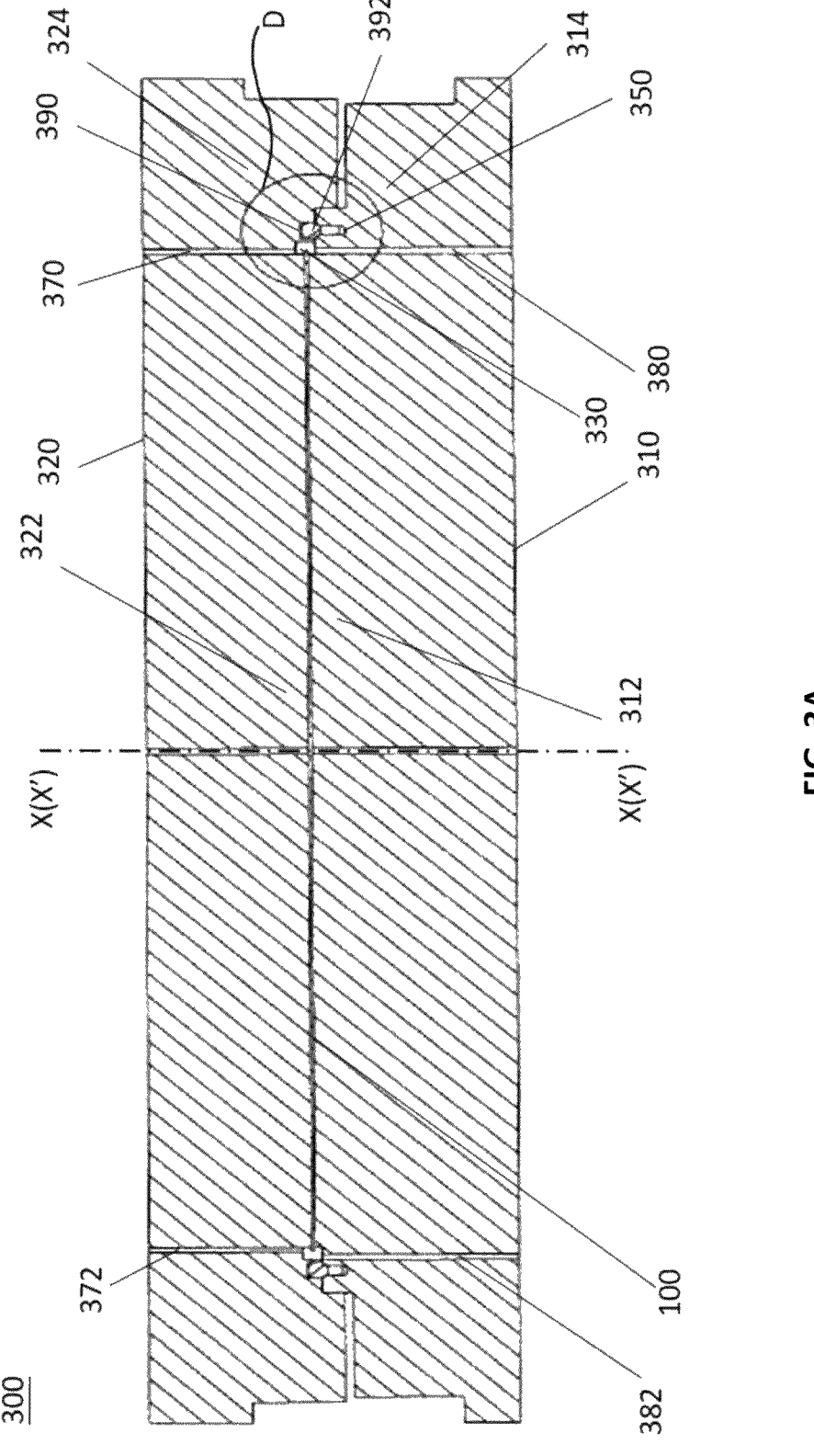
Figure 3B:
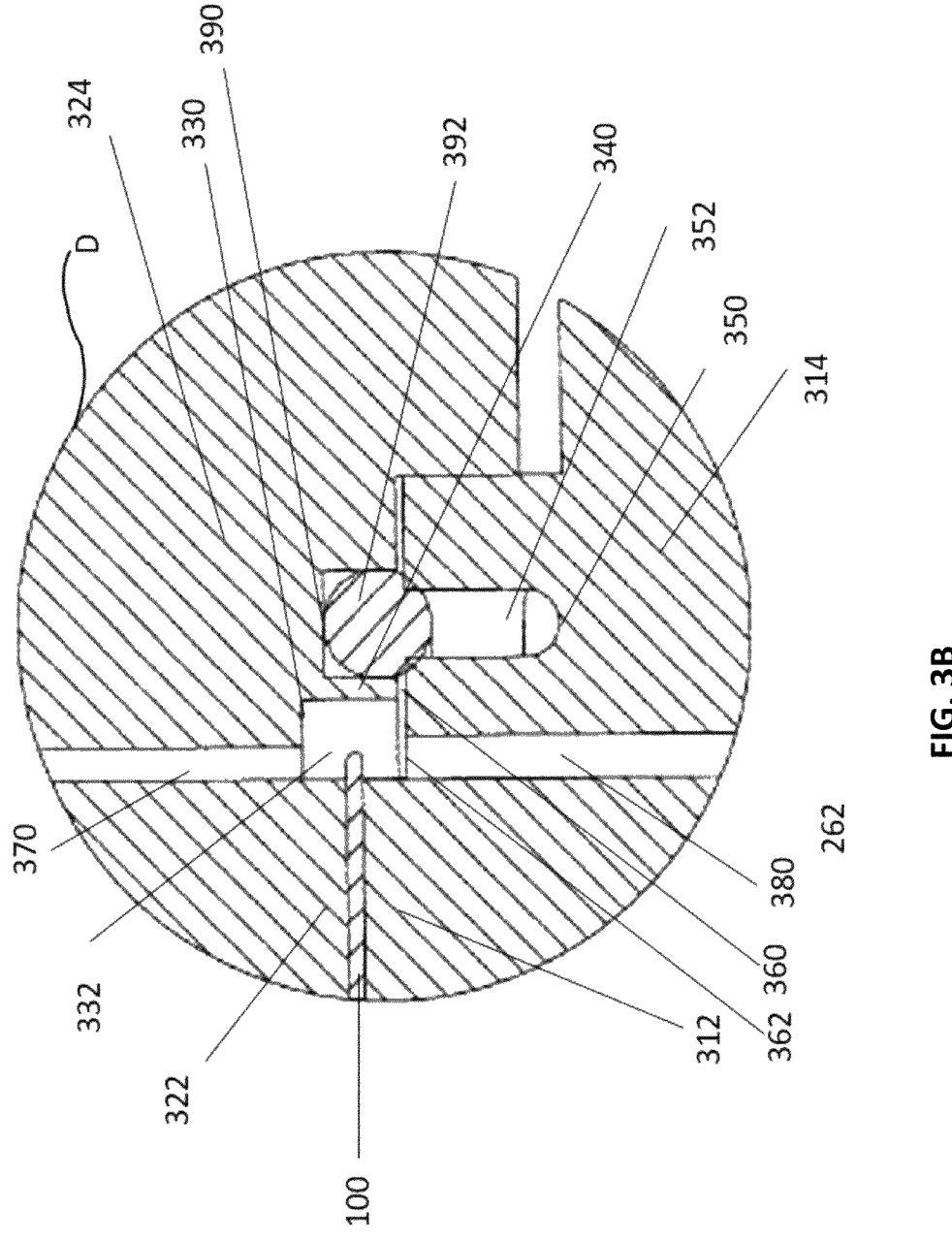

FIG. 3A illustrates a cross-section view of an exemplary apparatus 300, according to exemplary implementations of the present disclosure FIG. 3B illustrates a detailed view of a circle D shown in FIG. 3A.

Figure 3C:
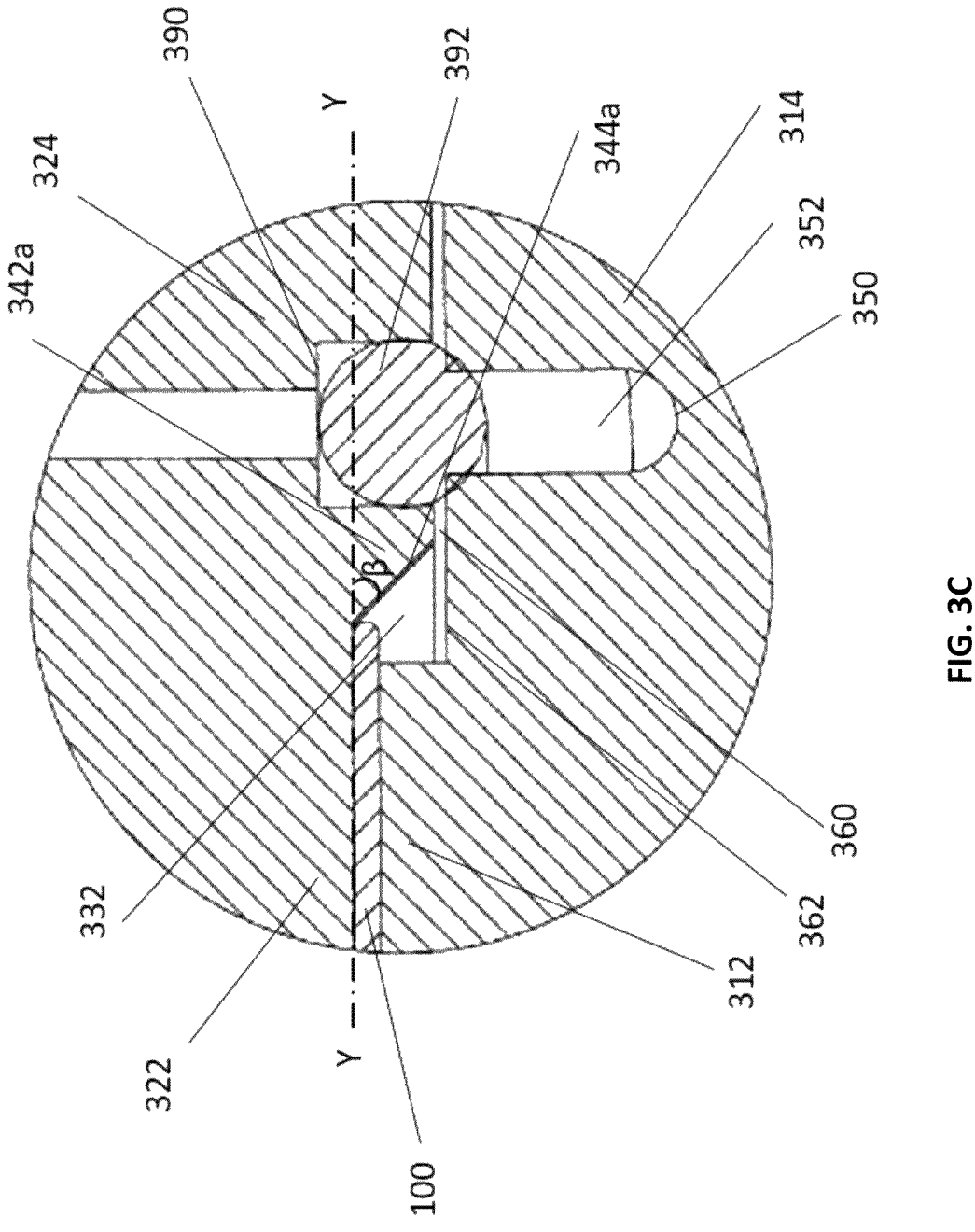

FIG. 3C illustrates a detailed view of a circle D shown in FIG. 3A with a jut 342.

Figure 3D:
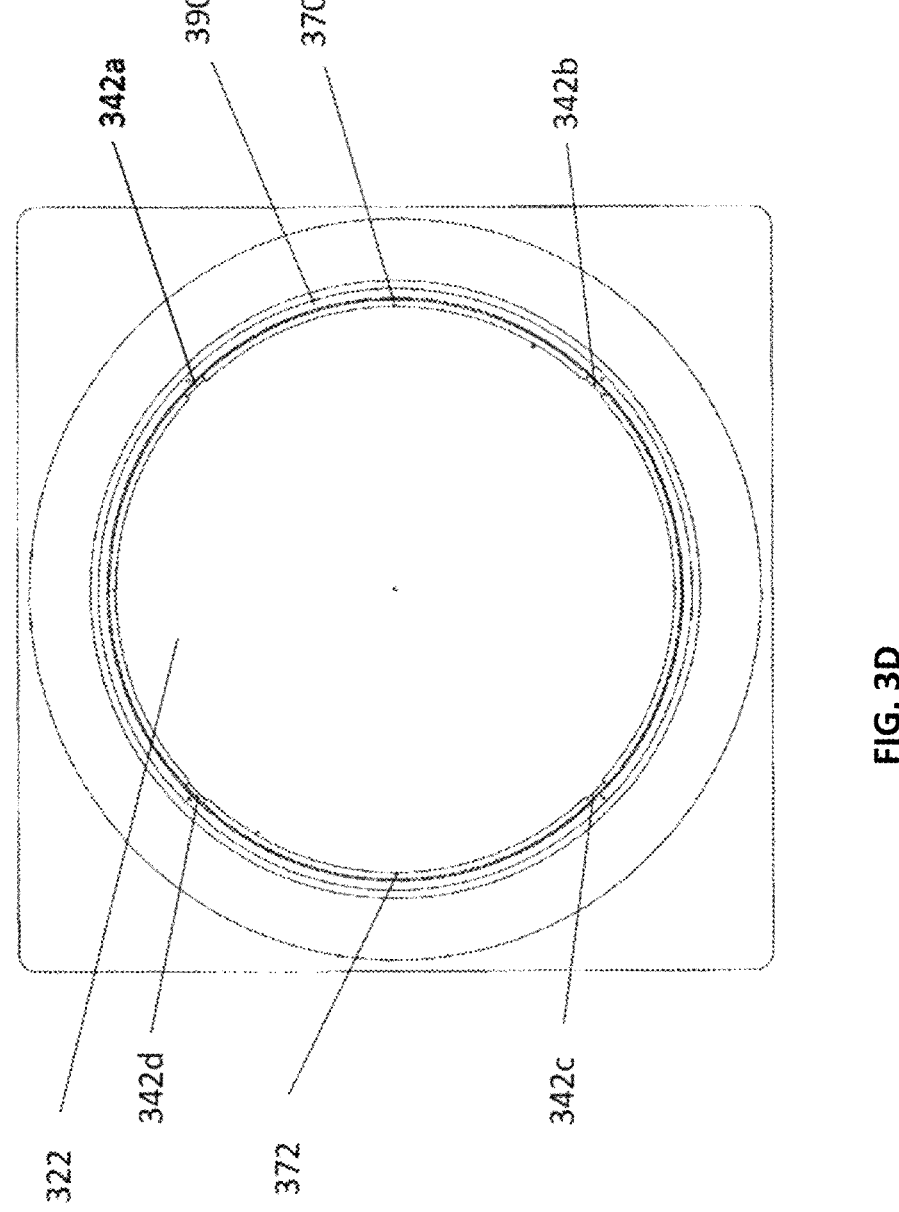

FIG. 3D illustrates a bottom view of an upper chamber 320 of exemplary apparatus 300 shown in FIG. 3A, according to exemplary implementations of the present disclosure.

Figure 3E:
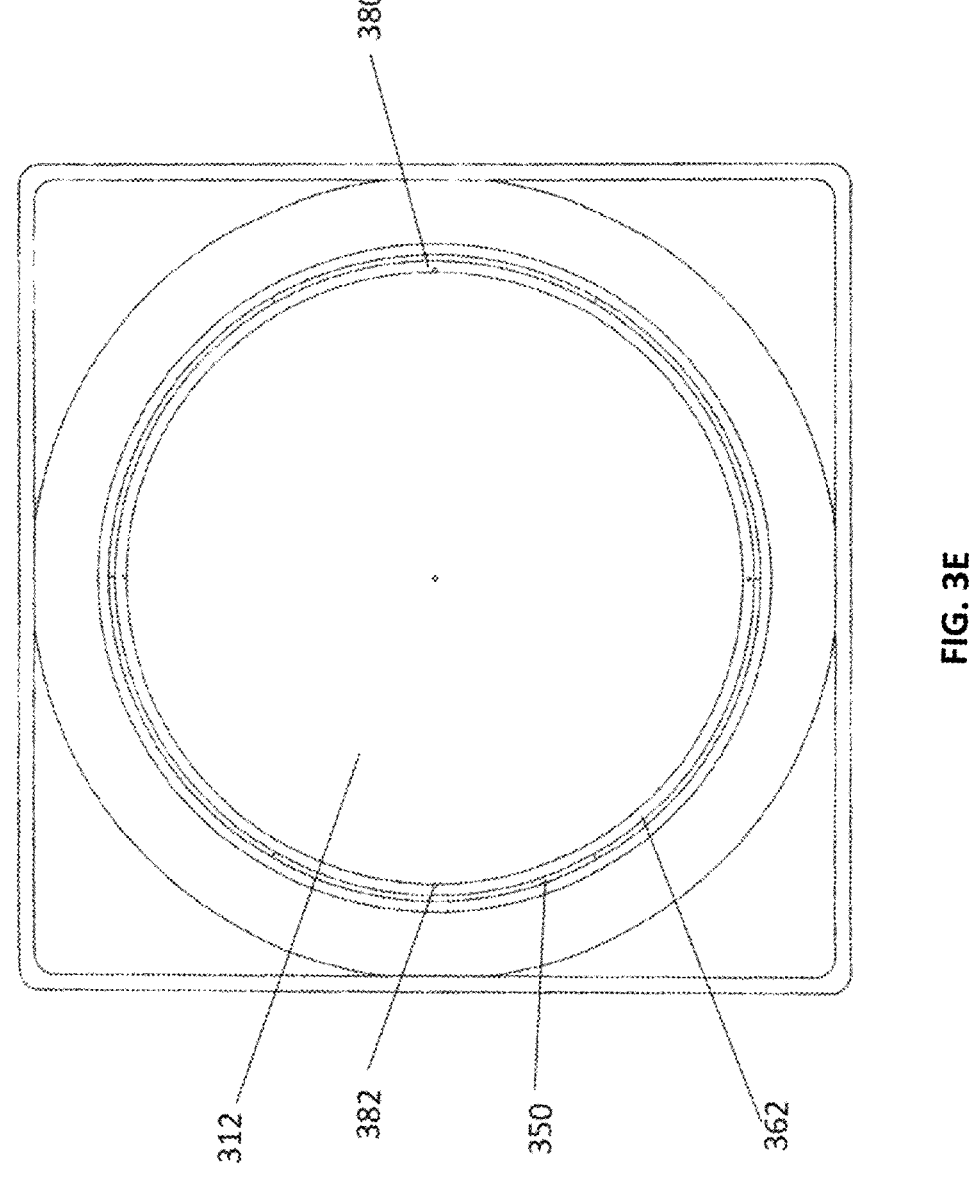

FIG. 3E illustrates a top view of a lower chamber 310 of exemplary apparatus 300 shown in FIG. 3A, according to exemplary implementations of the present disclosure.

Figure 4A:
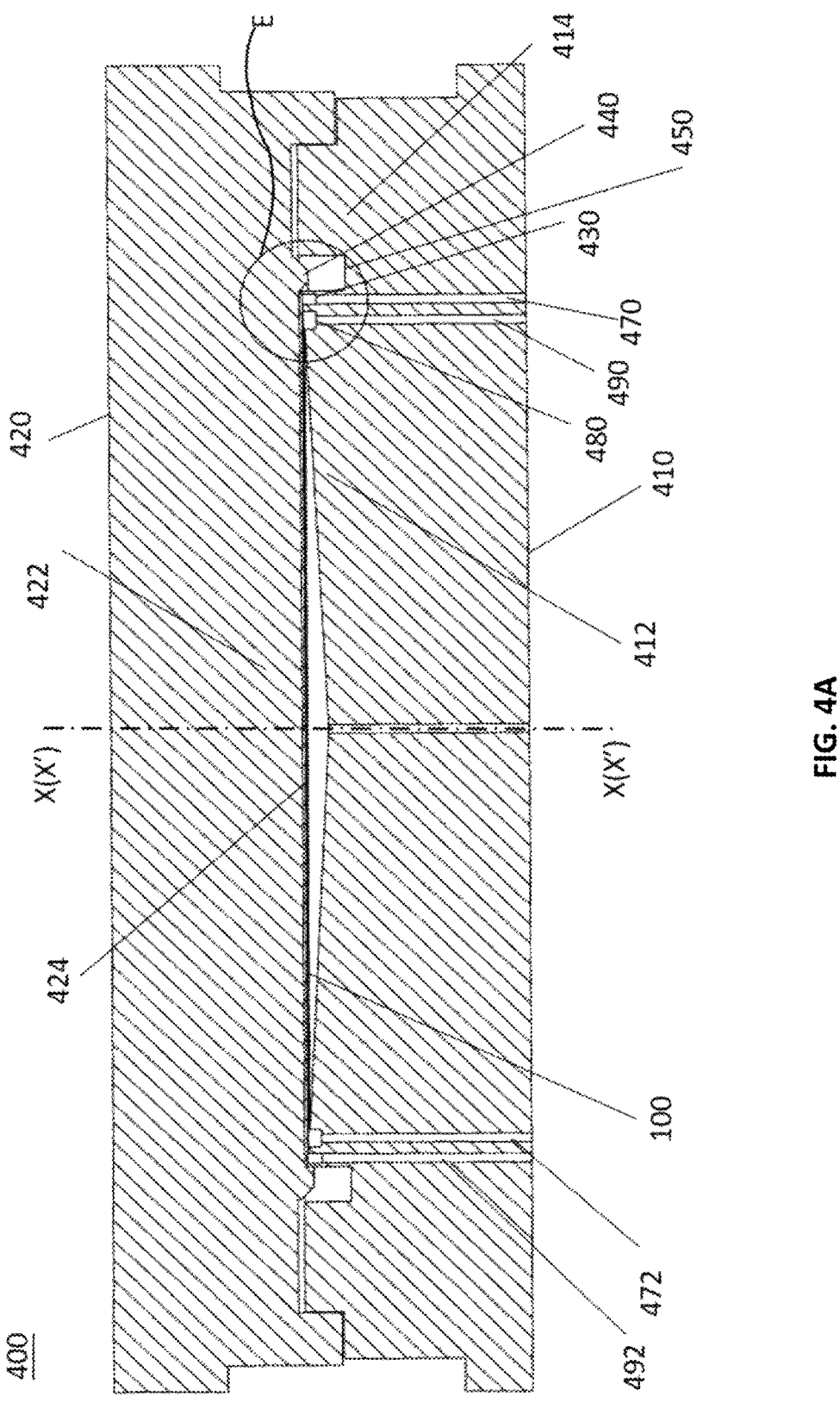

FIG. 4A illustrates a cross-section view of an exemplary apparatus 400, according to exemplary implementations of the present disclosure.

Figure 4B:
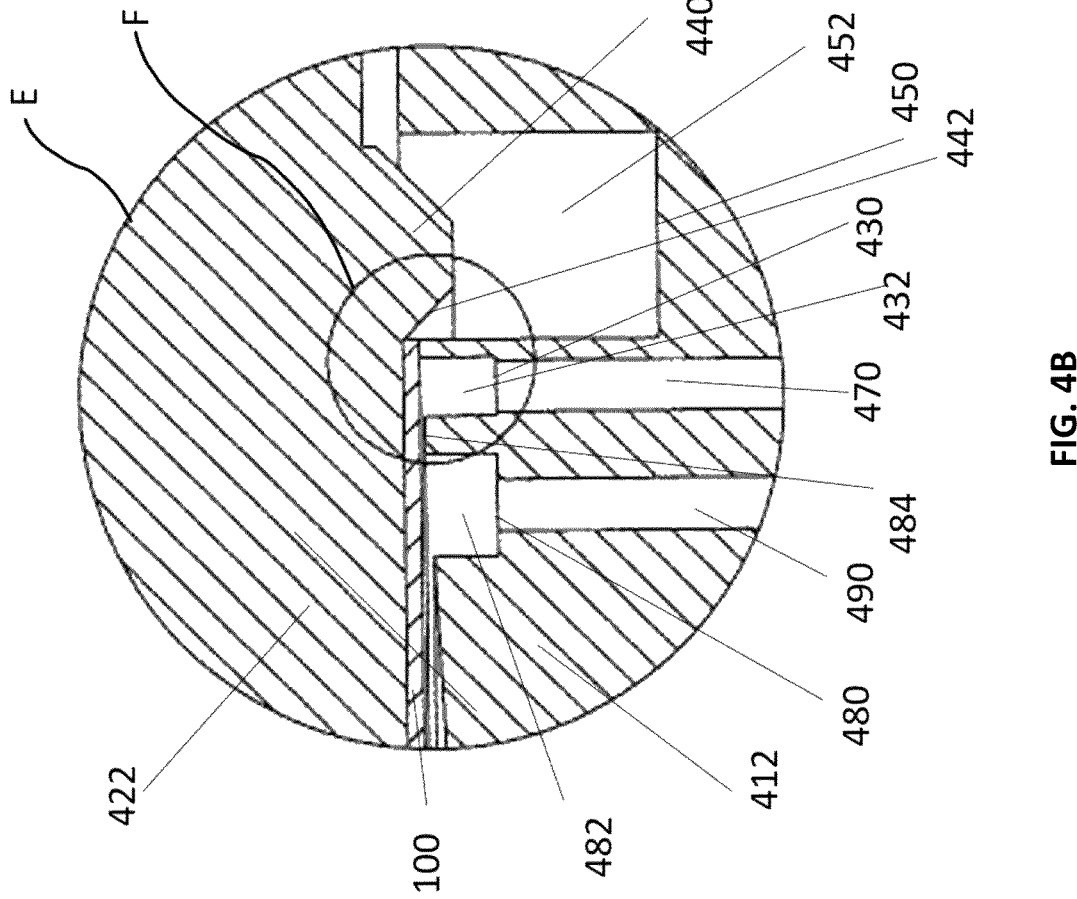

FIG. 4B illustrates a detailed view of a circle E shown in FIG. 4A, according to exemplary implementations of the present disclosure.

Figure 4C:
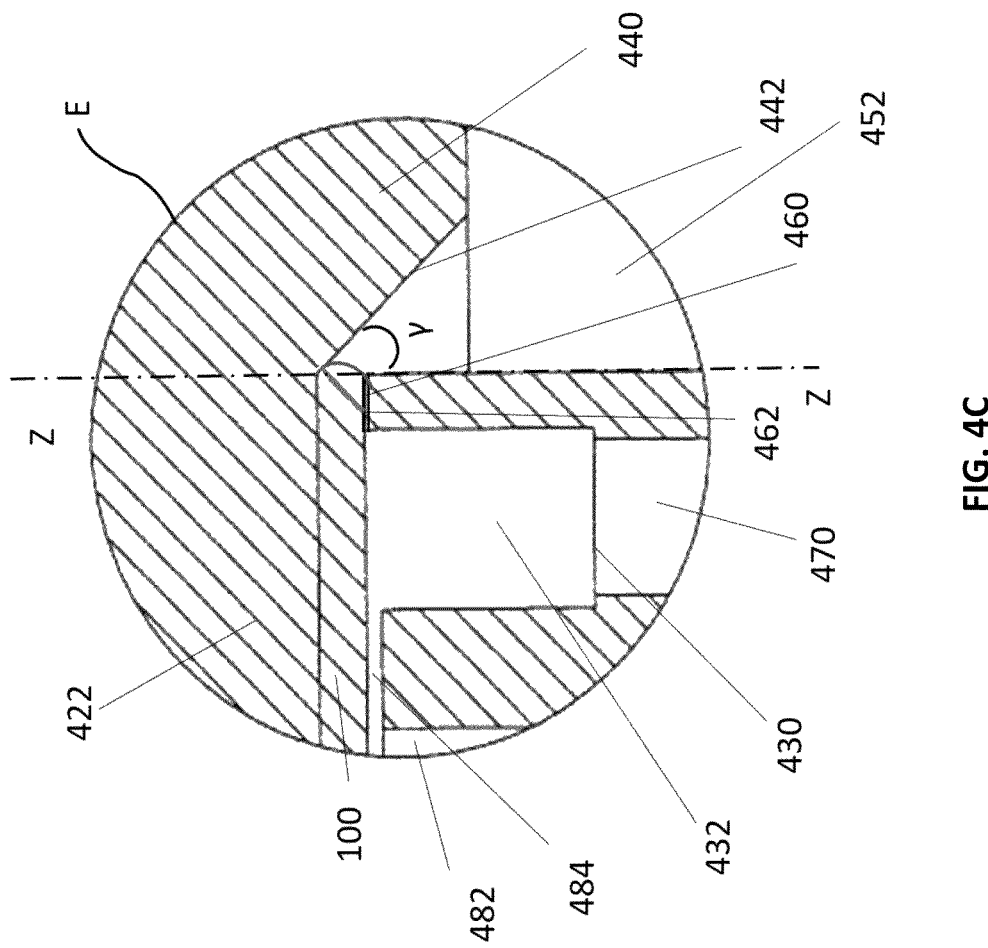

FIG. 4C illustrates a detailed view of a circle F shown in FIG. 4B, according to exemplary implementations of the present disclosure.

Figure 4D:
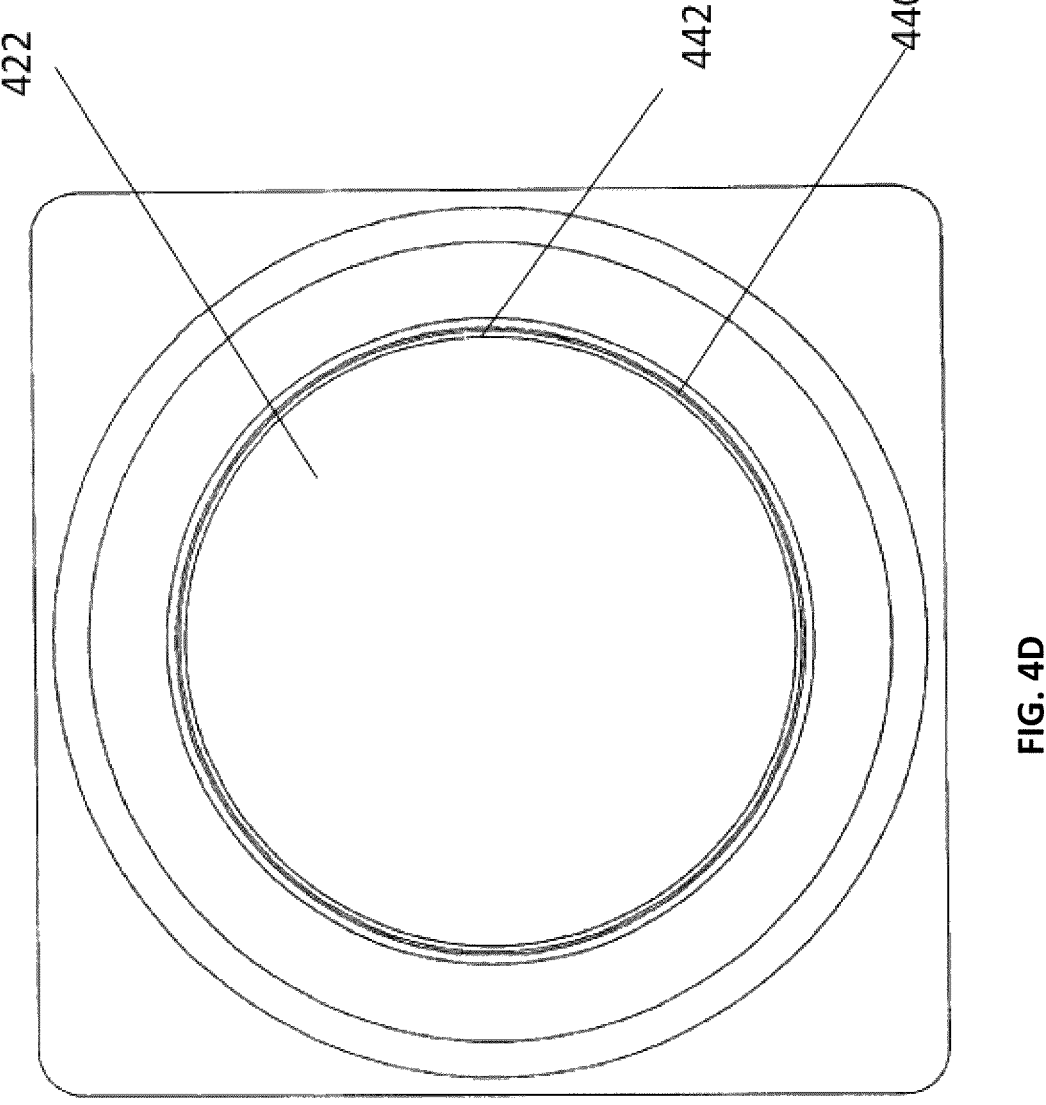

FIG. 4D illustrates a bottom view of an upper chamber 420 of exemplary apparatus 400 shown in FIG. 4A, according to exemplary implementations of the present disclosure.

Figure 4E:
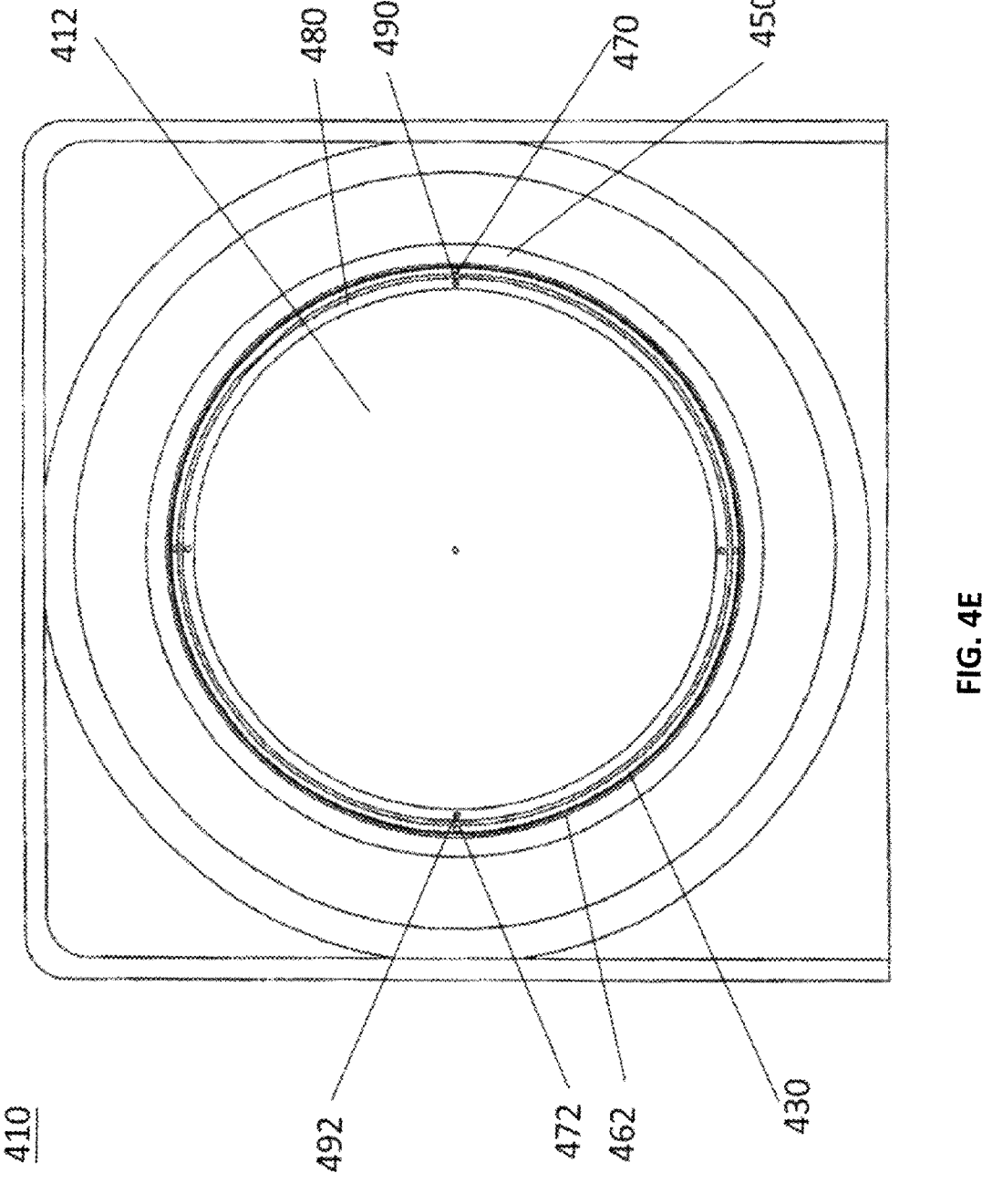

FIG. 4E illustrates a top view of a lower chamber 410 of exemplary apparatus 400 shown in FIG. 4A, according to exemplary implementations of the present disclosure.

Figure 5:
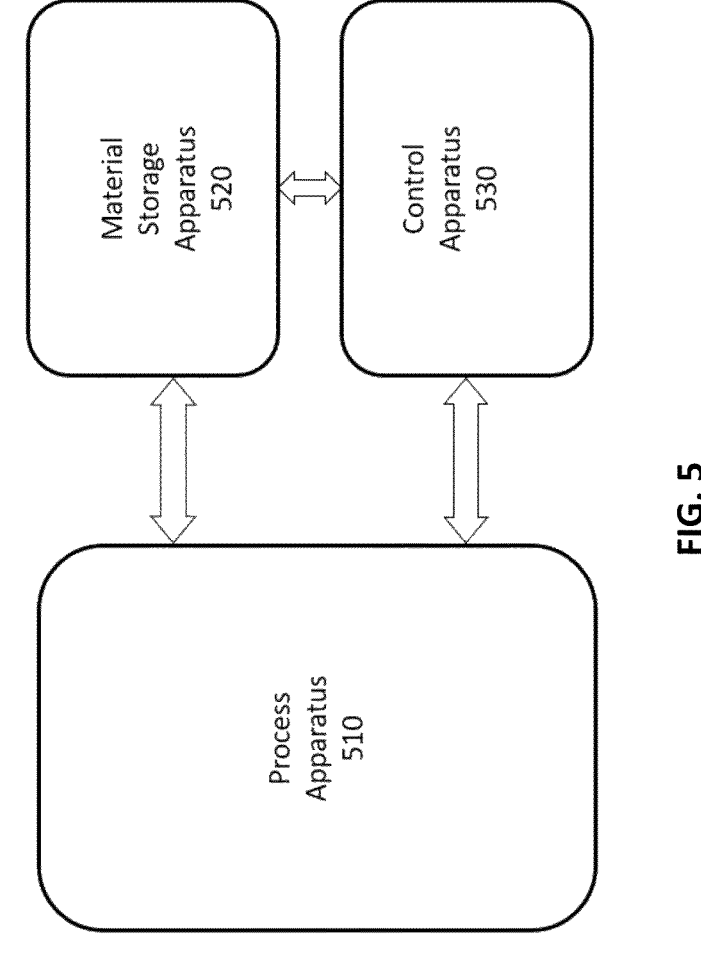

FIG. 5 illustrates an exemplary system 500 comprising a processing apparatus and a material storage apparatus, according to exemplary implementations of the present disclosure.

FIG. 6 illustrates an exemplary method using an apparatus to process an edge area of a semiconductor wafer 100, according to exemplary implementations of the present disclosure.

DETAILED DESCRIPTION OF THE DRAWINGS

Some implementations of the present disclosure will now be described more fully hereinafter with reference to the accompanying figures, in which some, but not all implementations of the disclosure are shown. Indeed, various implementations of the disclosure may be embodied in many different forms and should not be construed as limited to the implementations set forth herein; rather, these exemplary implementations are provided so that this disclosure will be thorough and complete, and will fully convey the scope of the disclosure to those skilled in the art. For example, unless otherwise indicated, reference to something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

FIGS. 1A through 1B illustrate a schematic diagram of a semiconductor wafer 100. FIG. 1A illustrates a top view of the schematic diagram of a semiconductor wafer 100. FIG. 1B illustrates a cross-section view of semiconductor wafer 100 along the direction A-A of FIG. 1A. As shown in FIGS. 1A-1B, semiconductor wafer 100 includes a substrate layer 101 and a thin layer 102 deposited on the first side surface of substrate layer 101, and substrate layer 101 can be partially covered by thin layer 102. In another implementation, substrate layer 101 can be fully covered by thin layer 102. In another implementation, both sides of surface of substrate layer 101 can be respectively covered by a thin layer 102.

In some embodiments, in processing operations of the semiconductor wafer, thin layer 102 shall be removed from substrate layer 101. For example, as shown in FIGS. 1A-1B, a radius of thin layer 102 is smaller than a radius of substrate layer 101, and an etched width refers to a difference between the two radii. Measurement points 1-8 are positions that measure related data of the semiconductor wafer, as illustrated in FIG. 1A. The etched width shall be substantially the same at each of the measurement points 1-8. The smaller the difference between the maximum and minimum etch widths, the higher the uniformity will be. For example, when the edged width is designed for 0.7 mm, the difference between the maximum etched width and the minimum etched width shall not be more than 0.1 mm. In some embodiments, thin layers covering both sides of a surface of substrate layer 101 shall be partially or completely removed. The etched width for each side of the surface of substrate layer 101 can be the same or different.

FIGS. 2A through 2F illustrate an exemplary apparatus 200, according to exemplary implementations of the present disclosure. FIG. 2A illustrates a cross-section view of exemplary apparatus 200. FIG. 2B illustrates a detailed view of a circle A shown in FIG. 2A. FIG. 2C illustrates a simplified detailed view of a circle B shown in FIG. 2B (omitting through holes). FIG. 2D illustrates a detailed view of a circle C shown in FIG. 2C. FIG. 2E illustrates a bottom view of an upper chamber 220 of exemplary apparatus 200 as shown in FIG. 2A. FIG. 2F illustrates a top view of a lower chamber 210 of exemplary apparatus 200 as shown in FIG. 2A.

In one exemplary implementation, as shown in FIGS. 1 through 2, apparatus 200 comprises a lower chamber 210 having a first supporting area 212. The first supporting area 212 may be configured to support a wafer 100. For example, as shown in FIG. 2A, the first supporting area 212 may have an upper surface facing wafer 100. Wafer 100 may be placed on the upper surface of the first supporting area 212. In some implementations, apparatus 200 may comprise an upper chamber 220 having a second supporting area 222. For example, as shown FIG. 2A, the second supporting area 222 may have a lower surface facing wafer 100. Upper chamber 220 may be engaged with lower chamber 210 to place wafer 100 between the first supporting area 212 and the second supporting area 222. For example, upper chamber 220 may move between two positions relative to lower chamber 210. In the first position, wafer 100 can be loaded to and/or unloaded from the first supporting area 212. In the second position, upper chamber 220 and lower chamber 210 are engaged with each other so that wafer 100 may be fixed by the upper surface of the first supporting area 212 and the lower surface of the second supporting area 222 and may be accommodated for processing, as shown in FIG. 2A.

In some implementations or any combination of preceding exemplary implementations of apparatus 200, as shown in FIGS. 2A through 2C, apparatus 200 may comprise a first channel 230 formed at or by a peripheral area of the first supporting area 212 or the second supporting area 222. The first channel 230 may be configured to provide a first space 232 to flow one or more chemical fluids for etching an edge area of wafer 100. For example, as shown in FIGS. 2A through 2C, the first channel 230 may be formed at the peripheral area of the second supporting area 222 in upper chamber 220. The first channel 230 may be further formed on a lower surface of upper chamber 220, and an opening of the first channel 230 may face wafer 100. In one implementation, the first channel 230 may be configured to provide a first space 232, in which one or more chemical fluids may flow to etch the edge area of wafer 100. For example, as shown in FIGS. 2A through 2C, the first space 232 may be formed by an internal surface of the first channel 230 and wafer 100. In one implementation, the first channel 230 may be annular and around the edge area of wafer 100. The entire edge area of wafer 100 may be accommodated into the first space 232. In another implementation, the first channel 230 may be arranged as an arc with a radian less than 360 degrees, and an edge area of wafer 100 may be selectively accommodated into the first space 232. Then, the one or more chemical fluids may etch part of the edge area of the wafer in accordance with the arc of the first channel 230.

In some implementations or any combination of preceding exemplary implementations of apparatus 200, as shown in FIGS. 2A through 2C, upper chamber 220 may comprise a protrusion part 240 configured to resist against an edge of wafer 100. For example, the protrusion part may directly contact an edge of wafer 100, and further resist against the edge of wafer 100. In some implementations, as shown in FIG. 2A, a center axis X-X of wafer 100 may be perpendicular to an upper surface of wafer 100. A center axis X'-X' of the second supporting area 222 may be perpendicular to a lower surface of the second supporting area 222. Protrusion part 240 may be configured to align the center axis X-X of wafer 100 with the center axis X'-X' of the second supporting area 222. For example, when upper chamber 220 is located in a first position, wafer 100 is loaded onto the first supporting area 212. The center axis X-X of wafer 100 may not be aligned to the center axis X'-X' of a second supporting area 222. During the course that upper chamber 220 moves from a first position to a second position, protrusion part 240 may contact an edge of wafer 100, and then may resist against an edge of wafer 100, pushing wafer 100 to move on an upper surface of the first supporting area 212. When upper chamber 220 is located in the second position, the wafer may be fixed on the upper surface of the first supporting area 212 and the center axis X-X of wafer 100 may be parallel to the center axis X'-X' of the second supporting area 222. In another implementation, the center axis X-X of wafer 100 may overlap the center axis X'-X' of the second supporting area 222.

In some implementations or any combination of preceding exemplary implementations of apparatus 200, protrusion part 240 may be adjacent to the second supporting area 222 and extend toward lower chamber 210. For example, as shown in FIGS. 2A and 2B, protrusion part 240 may be connected to the second supporting area 222. Protrusion part 240 may extend toward lower chamber 210 where upper chamber 220 is located in a second position. In one implementation, protrusion part 240 may be formed next to the first channel 230, as shown in FIGS. 2A and 2B. In some implementations, as shown in FIG. 2A, the center axis X-X of wafer 100 may be perpendicular to an upper surface of wafer 100 and the center axis X'-X' of the second supporting area 222 may be perpendicular to a lower surface of upper chamber 220. The upper surface of wafer 100 may be parallel to the lower surface of the second supporting area. In one implementation, when the upper chamber is located in the second position, the upper surface of wafer 100 may overlap the lower surface of the second supporting area 222 and the center axis X-X of wafer 100 may overlap the center axis X'-X' of the second supporting area 222.

In some implementations or any combination of preceding exemplary implementations of the apparatus 200, protrusion part 240 may include a closed loop arranged around wafer 100. For example, as shown in FIG. 2A, protrusion part 240 includes a closed loop. The closed loop may be annular and around the entire edge area of wafer 100. Protrusion part 240 therefore may uniformly resist against the edge area of wafer 100 so that the center axis X-X of wafer 100 overlaps with the center axis X'-X' of the second supporting area 222. In some implementations, the closed loop may include an arc with a radian less than 360 degrees, and the edge area of wafer 100 may be selectively resisted by protrusion part 240 so that the center axis X-X of wafer 100 aligns and/or overlaps with the center axis X'-X' of the second supporting area 222. In some implementation, protrusion part 240 may include an open loop.

In some implementations or any combination of preceding exemplary implementations of apparatus 200, protrusion part 240 includes an inner corner facing towards the center axis X'-X' of the second supporting area 222. For example, as shown in FIG. 2C, protrusion part 240 may comprise an inner surface 242 inclining at an angle α to a first reference direction Y-Y. The first reference direction Y-Y may be parallel to a lower surface of the second supporting area 222. The angle α may be within a range of 20°-90°. The inner corner may be formed by inner surface 242 and an inner surface of the first channel 230 and may face towards the center axis X'-X' of the second supporting area 222, as shown in FIGS. 2B and 2C. In one implementation, the inner corner may be configured to resist against an edge area of wafer 100. For examples, as shown in FIG. 2B, during the course that upper chamber 220 moves from a first position to a second position, an inner corner of protrusion part 240 may contact an edge area of wafer 100, and then may resist against an edge of wafer 100, pushing wafer 100 to move. When upper chamber 220 is located in the second position, the wafer may be fixed and the center axis X-X of wafer 100 may be parallel to the center axis X'-X' of the second supporting area 222. In another implementation, the center axis X-X of wafer 100 may overlap the center axis X'-X' of the second supporting area 222.

In some implementations or any combination of preceding exemplary implementations of apparatus 200, a first groove 250 may be formed at or by a peripheral area 214 of lower chamber 210 and configured to provide a first groove space 252 to flow one or more chemical fluids. For example, as shown in FIGS. 2A, 2B and 2F, the first groove 250 may be formed at peripheral area 214 of lower chamber 210, and positioned close to the first supporting area 212 of lower chamber 210. The first groove 250 may provide a first groove space 252 and the one or more chemical fluids can flow from the first space 232 of the first channel 230 to the first groove space 252.

In some implementations or any combination of preceding exemplary implementations of apparatus 200, a passage 260 may be formed between upper chamber 220 and lower chamber 210. For example, as shown in FIGS. 2B and 2F, lower chamber 210 may comprise a first upper surface 262 between the first supporting area 212 and the first groove 250. Passage 260 may be formed between the first upper surface 262 of lower chamber 210 and inner surface 242 of protrusion part 240. Passage 260 may connect the first space 232 with the first groove space 252 for facilitating the one or more chemical fluids to flow from the first space 232 to the first groove space 252 via passage 260. In one embodiment, passage 260 may be blocked by protrusion part 240 from flowing the one or more chemical fluids from the first space 232 to the first groove space 252. In another implementation, passage 260 may be blocked by the first supporting area 210 from flowing the one or more chemical fluids from the first space 232 to the first groove space 252.

In some implementations or any combination of preceding exemplary implementations of apparatus 200, a first channel 230 may be formed at a peripheral area of the second supporting area 222, as shown in FIGS. 2A through 2C. Upper chamber 220 may further comprise a first through hole 270 configured to facilitate the one or more chemical fluids to flow between a first space 232 and an outside of apparatus 200. For example, the first through hole 270 may pass through upper chamber 220 from an outside of apparatus 200 to communicate with the first space 232. In one implementation, the one or more chemical fluids may flow between the first space 232 and an outside of apparatus 200 via the first through hole 270. In another implementation, upper chamber 220 may further comprise two or more first through holes (e.g., a secondary first through hole 272, as shown in FIGS. 2A and 2E) which may be substantially the same as the first through hole 270. In this implementation, at least one first through hole (e.g., the first through hole 270) may be configured to serve as an inlet and the rest first through hole(s) (e.g., the secondary first through hole 272) may be configured to serve as an outlet. The first space 232 may connect to an outside of apparatus 200 via the first through hole 270 and the secondary first through hole 272. In this implementation, the one or more chemical fluids may flow into the first space 232 of the first channel 230 from the outside of apparatus 200 via the first through hole 270, and flow out of the first space 232 to the outside of apparatus 200 via the secondary first through hole 272.

In some implementations or any combination of preceding exemplary implementations of apparatus 200, a second channel 280 may be formed at or by a peripheral area of the first supporting area 212 and configured to provide a second space 282 to flow one or more chemical fluids for etching an edge area of wafer 100. For example, as shown in FIGS. 2A through 2C, a second channel 280 may be formed at a peripheral area of the first supporting area 212 in lower chamber 210. The second channel 280 may be further formed on an upper surface of lower chamber 210, and an opening of the second channel 280 may face toward wafer 100, as shown in FIGS. 2A and 2F. In one implementation, the second channel 280 may be configured to provide a second space 282, in which the one or more chemical fluids may flow to etch an edge area of wafer 100. For example, as shown in FIGS. 2A through 2C, a second space may be formed by an internal surface of the second channel 280 and wafer 100. In one implementation, the second channel 280 may be annular and around an edge area of wafer 100. The entire edge area of wafer 100 may be accommodated into the second space 282. In another implementation, the second channel 280 may be arranged as an arc with a radian less than 360 degrees, and the edge area of wafer 100 may be selectively accommodated into the second space 282. Then, the one or more chemical fluids may etch a part of the edge area of the wafer in accordance with the arc of the second channel 280. In some implementations, the second channel 280 may be arranged in a shape identical to the first channel 230. In some implementations, the second channel 280 may be arranged close to the first upper surface 262 between the first supporting area 212 and the first groove 250. A passage 260 may be formed between the first upper surface 262 of lower chamber 210 and inner surface 242 of upper chamber 220. Passage 260 may connect the second space 282 with the first groove space 252 for facilitating the one or more chemical fluids to flow from the second space 282 to the first groove space 252 via passage 260. In one embodiment, passage 260 may be blocked by protrusion part 240 from flowing the one or more chemical fluids from the second space 282 to the first groove space 252. In another implementation, passage 260 may be blocked by the first supporting area 210 from flowing the one or more chemical fluids from the second space 282 to the first groove space 252.

In some implementations or any combination of preceding exemplary implementations of apparatus 200, lower chamber 210 may comprise a second through hole 290 configured to facilitate one or more chemical fluids to flow between a second space 282 and an outside of apparatus 200. For example, as shown in FIGS. 2A and 2B, the second through hole 290 may pass through lower chamber 210 from an outside of apparatus 200 to communicate with the second space 282 of the second channel 280. In one implementation, the one or more chemical fluids may flow between the second space 282 and the outside of apparatus 200 via the second through hole 290. In another implementation, the one or more chemical fluids may flow from the outside of apparatus 200 to the second space 282 of the second channel 280 via the second through hole 290, and then flow from the second space 282 of the second channel 280 to the first groove space 252 of the first groove 250 via passage 260. In some implementations, lower chamber 210 may further comprise one or more second through holes (e.g., a secondary second through hole 292, as shown in FIG. 2A) which may be substantially the same as the second through hole 290. In this implementation, at least one second through hole (e.g., a second through hole 290) may be configured to serve as an inlet and the rest second through hole(s) (e.g., secondary second through hole(s) 292) may be configured to serve as an outlet. The second space 282 may connect to an outside of apparatus 200 via the second through hole 290 and the secondary second through hole 292. In one implementation, the one or more materials may flow into the second space 282 of the second channel 280 from the outside of apparatus 200 via the second through hole 290, and flow out of the second space 282 to the outside of apparatus 200 via the secondary second through hole 292. In another implementation, the one or more materials may flow into the second space 282 of the second channel 280 from the outside of apparatus 200 via the second through hole 290 and the secondary second through hole 292, and then flow from the second space 282 of the second channel 280 to the first groove space 252 of the first groove 250 via passage 260.

FIGS. 3A through 3E illustrate an exemplary apparatus 300, according to exemplary implementations of the present disclosure. FIG. 3A illustrates a cross-section view of exemplary apparatus 300. FIG. 3B is a detailed view of a circle D shown in FIG. 3A. FIG. 3C is a detailed view of the cross section of exemplary apparatus 300 where a protrusion part is located. FIG. 3D is a bottom view of an upper chamber 320 of exemplary apparatus 300 shown in FIG. 3A. FIG. 3E is a top view of a lower chamber 310 of exemplary apparatus 300 shown in FIG. 3A.

In one exemplary implementation, as shown in FIGS. 3A through 3E, apparatus 300 may comprise a lower chamber 310 having a first supporting area 312. Lower chamber 310 and the first supporting area 312 may respectively be referred to a lower chamber 210 and a first supporting area 212 as described above with reference to FIGS. 2A through 2F. Apparatus 300 may comprise an upper chamber 320 having a second supporting area 322. Upper chamber 320 and the second supporting area 322 may respectively be referred to an upper chamber 220 and a second supporting area 222 as described above with reference to FIGS. 2A through 2F. Upper chamber 320 may engaged with lower chamber 310 to place a wafer 100 between the first supporting area 312 and the second supporting area 322, as described above. Apparatus 300 may comprise a first channel 330 formed at or by a peripheral area of the first supporting area 312 or the second supporting area 322. The first channel 330 may be referred to a first channel 230 as described above with reference to FIGS. 2A through 2F. For example, the first channel 330 may be formed at the peripheral area of the second supporting area 322 in upper chamber 320 and configured to provide a first space 332 to flow one or more chemical fluids for etching an edge area of wafer 100. The first space 332 may be referred to a first space 232 as described above with reference to FIGS. 2A through 2F. In some implementations, the first space 332 of the first channel 330 may also be formed by an internal surface of the first channel 330, lower chamber 310, and wafer 100. An entire or a partial edge area of wafer 100 may be accommodated into the first space 332 of the first channel 330, and the one or more chemical fluids can contact and etch the edge area of wafer 100.

In some implementations or any combination of preceding exemplary implementations of apparatus 300, as shown in FIGS. 3A through 3D, upper chamber 320 may comprise a protrusion part 340 configured to resist against an edge of wafer 100 and to align a center axis X-X of wafer 100 with a center axis X'-X' of a second supporting area 322. Protrusion part 340 may be referred to a protrusion part 240 as described above with reference to FIGS. 2A through 2E. In some implementations, protrusion part 340 may include a plurality of juts 342 being circularly and evenly arranged around wafer 100 to uniformly resist against an edge area of wafer 100. Each of the plurality of juts 342 may extend from protrusion part 340 into a first space 332 of the first channel 330. For example, as shown in FIGS. 3C and 3D, protrusion part 340 comprises four juts (e.g., juts 342a through 342 d). Each of the plurality of juts 342 may comprise an inner surface 344 inclining at an angle β to a reference direction Y-Y. A range of angle β may be within 20°-90°. The inner surface may face toward to an edge of wafer 100. The reference direction Y-Y may be parallel to an upper surface of wafer 100, or perpendicular to the center axis X'-X' of the second supporting area 322. For example, as shown in FIG. 3C, jut 342a comprises an inner surface 344a, inclining at angle β to the reference direction Y-Y. Inner surface 344a may be arranged to resist against an edge of wafer 100 and push wafer 100 to move for aligning the center axis X-X of wafer 100 with the center axis X'-X' of the second supporting area 322. Protrusion 340 may include a plurality of juts 342. In some implementations, protrusion 340 may include six juts 342. In some implementations, protrusion 340 may include eights juts 342. In some implementations, protrusion 340 may include twelve juts 342.

In some implementations or any combination of preceding exemplary implementations of apparatus 300, as shown in FIGS. 3A through 3C, a first groove 350 may be formed at a peripheral area 314 of lower chamber 310 and configured to provide a first groove space 352 to flow one or more chemical fluids. The first groove 350, peripheral area 314 of lower chamber 310, and the first groove space 352 of the first groove 350 may respectively be referred to a first groove 250, a peripheral area 214 of a lower chamber 220, and a first groove space 252 of a first groove 250, respectively, as described above with reference to FIGS. 2A through 2F. In some implementations, a passage 360 may be formed between upper chamber 320 and lower chamber 310, connecting the first space 332 with the first groove space 352 for facilitating the one or more chemical fluids to flow from the first space 332 to the first groove space 352 via a passage 360. Passage 360 may be referred to a passage 260 as described above with reference to FIGS. 2A through 2F. In some implementations, passage 360 may be formed between protrusion part 340 and a first upper surface 362 of lower chamber 310. The first upper surface 362 may be adjacent to the first supporting area 312 and positioned between the first supporting area 312 and the first groove 350, as shown in FIGS. 3A through 3C and 3E.

In some implementations or any combination of preceding exemplary implementations of apparatus 300, upper chamber 320 may further comprise a first through hole 370 configured to facilitate one or more chemical fluids to flow between the first space 332 and an outside of apparatus 300, as shown in FIGS. 3A, 3B, and 3D. The first through hole 370 may be referred to a first through hole 270 as described above with reference to FIGS. 2A through 2E. In some implementations, upper chamber 320 may further comprise one or more first through holes (e.g., a secondary first through hole 372, as shown in FIGS. 3A and 3D), which may be substantially the same as the first through hole 370. An arrangement of the one or more first through holes may be referred to an arrangement of the one or more first through holes as described above with reference to FIGS. 2A and 2E.

In some implementations or any combination of preceding exemplary implementations of apparatus 300, as shown in FIGS. 3A, 3B, and 3E, lower chamber 310 may comprise a second through hole 380 configured to facilitate one or more chemical fluids to flow between a first space 332 and an outside of apparatus 300, as shown in FIGS. 3A and 3B. The second through hole 380 may pass through lower chamber 310 from an outside of apparatus 300 to communicate with a first space 332 of the first channel 330. In some implementations, the one or more chemical fluids may flow from an outside of apparatus 300 to the first space 332 via a second through hole 380 and then flow from the first space 332 to a first groove space 352 of the first groove 350 via a passage 360. In some implementations, the one or more chemical fluids may flow from an outside of apparatus 300 to the first space 332 of the first channel 330 via a first through hole 370, and then flow from the first space 332 to the first groove space 352 via passage 360 and to the outside of apparatus 300 via the second through hole 380.

In some implementations or any combination of preceding exemplary implementations of apparatus 300, a second groove 390 may be formed at or by a peripheral area 324 of upper chamber 320 and positioned above the first groove 350. For example, as shown in FIGS. 3A through 3D, the second groove 390 may be formed at a peripheral area 324 of upper chamber 320, and be close to a protrusion part 340. The second groove 390 may provide a second groove space to flow chemical fluids. An opening of the second groove 390 may face to lower chamber 310. The second groove 390 may be positioned above the first groove 350 such that the first groove space 352 of the first groove 350 may communicate with a second groove space of the second groove 390. The second groove 390 may be arranged in the same way as the first groove 350. For one example, the first groove 350 and the second groove 390 may be annual, as shown in FIGS. 3D and 3E. For another example, the first groove 350 and the second groove 390 may respectively be arranged as an arc with a radian less than 360 degrees.

In some implementations or any combination of preceding exemplary implementations of apparatus 300, an elastic component 392 may be placed between the first groove 350 and the second groove 390, as shown in FIGS. 3A through 3C. In some implementations, elastic component 392 may be placed in the first groove space 352 or in the second groove space. In some implementations, elastic component 392 may be placed in the first groove space 352 and the second groove space. In some implementations, elastic component 392 may be configured to block the one or more chemical fluids from flowing from the first space 332 to the first groove space 352. For example, a width of elastic component 392 may be wider than a width of the first groove 350 and a width of the second groove 390, as shown in FIGS. 3A through 3C. An inner surface of the first groove 350 and/or an inner surface of the second groove 390 may resist against elastic component 392. The one or more chemical fluids there may be blocked from flowing from the first space 332 to the first groove space 352.

In some implementations or any combination of preceding exemplary implementations of apparatus 300, elastic component 392 may be an O-ring.

FIGS. 4A through 4E illustrate an exemplary apparatus 400, according to exemplary implementations of the present disclosure. FIG. 4A illustrates a cross-section view of exemplary apparatus 400. FIG. 4B illustrates a detailed view of a circle E shown in FIG. 4A. FIG. 4C illustrates a detailed view of a circle F shown in FIG. 4B. FIG. 4D illustrates a bottom view of an upper chamber 420 of exemplary apparatus 400 shown in FIG. 4A. FIG. 4E illustrates a top view of a lower chamber 410 of exemplary apparatus 400 shown in FIG. 4A.

In one exemplary implementation, as shown in FIGS. 4A-4E, apparatus 400 may comprise a lower chamber 410 having a first supporting area 412. Lower chamber 410 and the first supporting area 412 may respectively be referred to a lower chamber 210 and a first supporting area 212 as described above reference to FIGS. 2A through 2F. Apparatus 400 may comprise an upper chamber 420 having a second supporting area 422. Upper chamber 420 and the second supporting area 422 may respectively be referred to an upper chamber 220 and a second supporting area 222 as described above with reference to FIGS. 2A through 2F. Apparatus 400 may comprise a first channel 430 formed at or by a peripheral area of the first supporting area 412. The first channel 430 may be referred to a first channel 230 as described above with reference to FIGS. 2A through 2F. For example, as shown in FIGS. 4A through 4C and 4E, the first channel 430 may be formed at a peripheral area of the first supporting area 412 in lower chamber 420 and configured to provide a first space 432 to flow one or more chemical fluids for etching an edge area of wafer 100. The first space 432 of the first channel 430 may also be formed by an internal surface of the first channel 430 and wafer 100. An entire or a partial edge area of wafer 100 may be accommodated into the first space 432 of the first channel 430, and the one or more chemical fluids can contact and etch an edge area of wafer 100.

In some implementations or any combination of preceding exemplary implementations of apparatus 400, as shown in FIGS. 4A through 4D, upper chamber 420 may comprise a protrusion part 440 configured to resist against an edge of wafer 100 and to align a center axis X-X of wafer 100 with a center axis X'-X' of the second supporting area 422. Protrusion part 440 may be referred to a protrusion part 240 as described above with reference to FIGS. 2A through 2E. In some implementations, protrusion part 440 may be positioned adjacent to a lower surface 424 of the second supporting area 422, facing toward lower chamber 410. In some implementations, protrusion part 440 may include a plurality of juts being circularly and evenly arranged around wafer 100 to uniformly resist against an edge area of wafer 100. The juts may be referred to juts 342 as described above with reference to FIGS. 3A through 3D.

In some implementations or any combination of preceding exemplary implementations of apparatus 400, protrusion part 440 may include an inner surface 442 inclining at an angle to the center axis X'-X' of the second supporting area 442, and inner surface 442 may be configured to resist against an edge area of wafer 100. For example, as shown in FIG. 4A through 4D, the inner surface 442 may face toward wafer 100 and contact an edge of wafer 100. The inner surface 442 may be inclined at angle $\gamma$ to a reference axis Z-Z. A range of angle $\gamma$ may be within 20°-90°. The reference axis Z-Z may be parallel to the center axis X'-X' of the second supporting area 442. In some implementations, inner surface 442 of protrusion part 440 may contact and resist against an edge of wafer 100, and therefore may align the center axis X-X of wafer 100 with the center axis X'-X' of the second supporting area 422. In some implementation, inner surface 442 of protrusion part 440 may push wafer 100 to move and arrange the center axis X-X of wafer 100 to overlap the center axis X'-X' of the second supporting area 422.

In some implementations or any combination of preceding exemplary implementations of apparatus 400, as shown in FIGS. 4A, through 4C and 4E, a first groove 450 may be formed at or by a peripheral area 414 of lower chamber 410 and configured to provide a first groove space 452 to flow one or more chemical fluids. The first groove 450, peripheral area 414 of lower chamber 410, and the first groove space 452 of the first groove 450 may respectively be referred to a first groove 250, a peripheral area 214 of lower chamber 220, and a first groove space 252 of the first groove 250 as described above with reference to FIGS. 2A-2F. In some implementations, a passage 460 may be formed between upper chamber 420 and lower chamber 410, connecting the first space 432 with the first groove space 452 for facilitating the one or more chemical fluids flow from the first space 432 to the first groove space 452 via passage 460. Passage 460 may be referred to a passage 260 as describe above with reference to FIGS. 2A-2D. In some implementations, passage 460 may be formed between wafer 100 and a first upper surface 462 of lower chamber 410, as shown in FIG. 4C. The first upper surface 462 may be located between the first channel 430 and the first groove 450, as shown in FIGS. 4C and 4E.

In some implementations or any combination of preceding exemplary implementations of apparatus 400, as shown in FIGS. 4A through 4C and 4E, lower chamber 420 may further comprise a first through hole 470 configured to facilitate the one or more chemical fluids to flow between the first space 432 and an outside of apparatus 400. The first through hole 470 may be referred to a first through hole 270 as described above with reference to FIGS. 2A-2E. In some implementations, lower chamber 420 may further comprise one or more first through holes (e.g., a secondary first through hole 472, as shown in FIGS. 4A and 4E) which may be substantially the same as the first through hole 470. An arrangement of the one or more first through holes may be referred to an arrangement of the one or more first through holes as described above with reference to FIGS. 2A and 2E.

In some implementations or any combination of preceding exemplary implementations of apparatus 400, as shown in FIGS. 4A, 4B, and 4E, a second channel 480 may be formed at a peripheral area of the first supporting area 412 and configured to provide a second space 482 to flow the one or more chemical fluids for etching an edge area of wafer 100. The second channel 480 may be referred to a second channel 280 as described above with reference to FIGS. 2B, 2C, and 2F. In some implementations, the first channel 430 and the second channel 480 may be connected by a passway 484 for facilitating the one or more chemical fluids flow between the first space 432 of the first channel 430 and the second space 482 of the second channel 480 via passway 484. For example, as shown in FIGS. 4B and 4C, passway 484 may be formed by wafer 100 and the first supporting area 412 of lower chamber 410, connecting the first channel 430, and the second channel 480. The one or more chemical fluids may flow between the first space 432 and the second space 482 via a passway 484. In some implementations, the one or more chemical fluids may flow from the second space 482 to the first groove space 452 by going through passway 484, the first space 432, and passage 460.

In some implementations or any combination of preceding exemplary implementations of apparatus 400, as shown in FIGS. 4A, 4B and 4E, lower chamber 410 may comprise a second through hole 490 configured to facilitate the one or more chemical fluids to flow between the second space 482 and an outside of apparatus 400. The second through hole 490 may be referred to a second through hole 290 as described above with reference to FIGS. 2A-2C. In some implementations, lower chamber 410 may further comprise one or more second through holes (e.g., a secondary second through hole 492, as shown in FIGS. 4A and 4E) which may be substantially the same as the second through hole 490. An arrangement of the one or more second through holes may be referred to an arrangement of the one or more second through holes as described above with reference to FIG. 2A.

FIG. 5 illustrates an exemplary system 500 comprising a processing apparatus 510 and a material storage apparatus 520, according to exemplary implementations of the present disclosure. Processing apparatus 510 may be referred to one of apparatus 200, apparatus 300, and apparatus 400 as described above with reference to FIGS. 2A-2F, 3A-3E, and 4A-4E. For example, processing apparatus 510 may comprise a lower chamber having a first supporting area configured to support a wafer; an upper chamber having a second supporting area, and the upper chamber being engaged with the lower chamber to place the wafer between the first supporting area and the second supporting area; and a first channel formed at a peripheral area of the first supporting area or the second supporting area, the first channel being configured to provide a first space to flow one or more chemical fluids for etching an edge area of the wafer. In some implementations, the upper chamber comprises a protrusion part being configured to resist against an edge of the wafer and to align a center axis of the wafer with a center axis of the second supporting area. Material storage apparatus 520 may be connected to processing apparatus 510. Material storage apparatus 520 may be configured to store the one or more chemical fluids and transfer the one or more chemical fluids between processing apparatus 510 and material storage apparatus 520. In some implementations, the one or more chemical fluids may be selected from H3PO4, HF, HCl, HNO3, H2O2, or any combination thereof.

In some implementations or any combination of preceding exemplary implementations of system 500, the protrusion part may be adjacent to the second supporting area and extend toward the lower chamber. The center axis of the wafer may be perpendicular to an upper surface of the wafer, the center axis of the second supporting area being perpendicular to a lower surface of the upper chamber, and the upper surface of the wafer being parallel to the lower surface of the second supporting area. In some implementations, the protrusion part may include a closed loop arranged around the wafer, and the protrusion part is configured to uniformly resist against an edge area of the wafer so that the center axis of the protrusion part overlaps with the center axis of the second supporting area.

In some implementations or any combination of preceding exemplary implementations of system 500, the protrusion part may be adjacent to the second supporting area and extend toward the lower chamber. The center axis of the wafer may be perpendicular to an upper surface of the wafer, the center axis of the second supporting area being perpendicular to a lower surface of the upper chamber, and the upper surface of the wafer being parallel to the lower surface of the second supporting area. In some implementations, the protrusion part may include a plurality of juts being circularly arranged around the wafer to uniformly resist against the edge area of the wafer.

In some implementations or any combination of preceding exemplary implementations of system 500, a first groove may be formed at a peripheral area of the lower chamber and configured to provide a first groove space to flow one or more chemical fluids. In some implementations, a passage may be formed between the upper chamber and the lower chamber, connecting the first space with the first groove space for facilitating the one or more chemical fluids to flow from the first space to the first groove space via the passage. In some implementations, a second groove may be formed at a peripheral area of the upper chamber and positioned above the first groove. In some implementations, an elastic component may be placed between the first groove and the second groove for blocking the one or more chemical fluids from flowing from the first space to the first groove space.

In some implementations or any combination of preceding exemplary implementations of system 500, system 500 may comprise a control apparatus 530. Control apparatus 530 may communicate and control processing apparatus 510 and material storage apparatus 520. For example, control apparatus 530 can control a move of the upper chamber between a first position of loading/unloading the wafer and a second position of engaging the upper chamber and the lower chamber to process the wafer, the speed of the flow of the one or more chemical fluids, and the direction of the flow of the one or more chemical fluids. Control apparatus 530 can detect the speed of the flow of the one or more chemical fluids, the direction of the flow of the one or more chemical fluids, the condition of the one or more chemical fluids, and the mal-function of processing apparatus 510. In some implementations, control apparatus may comprise a PLC, a controller, a sensor, a storage device (e.g., memory, hard drive, SSD, etc.).

FIG. 6 illustrates an exemplary method 600 using an apparatus to process an edge area of a semiconductor wafer 100, according to exemplary implementations of the present disclosure. The method may utilize the apparatus which may be referred to one of apparatus 200, apparatus 300, apparatus 400, or apparatus 500, as described above with reference to FIGS. 2A-2F, 3A-3E, 4A-4E, and 5.

In an exemplary implementation, as shown in FIG. 6, at step 602, an apparatus 200 (or apparatus 300, apparatus 400, or apparatus 500) receives and places a wafer on a first supporting area of a lower chamber of the apparatus. At step 604, the apparatus engages its upper chamber with its lower chamber to place the wafer between the first supporting area and a second supporting area of the upper chamber. At step 606, a first channel is formed at a peripheral area of the first supporting area or the second supporting area, where in the first channel provides a first space. At step 608, the apparatus uses a protrusion part to resist against an edge of the wafer and to align a center axis of the wafer with a center axis of the second supporting area. At step 610, the apparatus injects one or more chemical fluids into the first space for etching an edge area of the wafer.

In some implementations or any combination of preceding exemplary implementations of method 600, at step 602, a wafer may be conveyed and placed by a wafer conveying apparatus onto a first supporting area of a lower chamber of apparatus 200 (or apparatus 300, apparatus 400, or apparatus 500). The first supporting area may have an upper surface facing the wafer. The wafer may be placed on the upper surface of the first supporting area, and part of a lower surface of the wafer is covered by an upper surface of the first supporting area. In some implementations, the upper chamber of apparatus 200 (or apparatus 300, apparatus 400, or apparatus 500) may be in a first position, where the wafer can be loaded to and/or unloaded from the first supporting area. For example, the wafer can be conveyed from the wafer conveying apparatus to the upper surface of the first supporting area.

In some implementations or any combination of preceding exemplary implementations of method 600, at step 604, apparatus 200 (or apparatus 300, apparatus 400, or apparatus 500) may engage an upper chamber with its lower chamber to place a wafer between a first supporting area and a second supporting area of the upper chamber. The upper chamber is in a second position where the lower chamber may be engaged with the upper chamber and the wafer may be fixed between the lower chamber and the upper chamber for facilitating a process of an edge area of the wafer. The upper chamber may comprise a second supporting area, which may have a lower surface facing the wafer. The upper chamber may be engaged with the lower chamber to place the wafer between the first supporting area and the second supporting area. For example, the wafer may be fixed between the lower surface of the second supporting area and the upper surface of the first supporting area.

In some implementations or any combination of preceding exemplary implementations of method 600, at step 606, a first channel may be formed at a peripheral area of a first supporting area or a second supporting area. The first channel may be further formed on a lower surface of the upper chamber, and an opening of the first channel may face toward the wafer. In some implementations, the first channel provides a first space for facilitating a process of an edge area of a wafer. For example, one or more chemical fluids may flow in the first channel and etch an edge area of wafer. In some implementations, the first channel may be arranged as a closed loop. In some implementations, the first channel may be arranged as a circle. Apparatus 200 (or apparatus 300, apparatus 400, or apparatus 500) or the wafer conveying apparatus may place the wafer in a way that an entire or a partial edge area of the wafer is accommodated into the first space for processing. In some implementations, the first channel may be arranged as an arc with a radian less than 360 degrees. Apparatus 200 (or apparatus 300, apparatus 400, or apparatus 500) or the wafer conveying apparatus may place the wafer in a way that a partial edge area of the wafer is accommodated into the first space for processing.

In some implementations or any combination of preceding exemplary implementations of method 600, at step 608, a protrusion part is formed on an upper chamber or a lower chamber of apparatus 200 (or apparatus 300, apparatus 400, or apparatus 500). The apparatus may use the protrusion part to resist against an edge of a wafer. For example, the protrusion part may contact the edge of the wafer during a course that the upper chamber moves from a first position to a second position. Then the protrusion part may resist against the edge of the wafer and push the wafer to move on an upper surface of a first supporting area of the lower chamber. When the upper chamber is engaged with the lower chamber, the wafer may be fixed on the upper surface of the first supporting area, and a center axis X-X of the wafer may be aligned with a center axis X'-X' of a second supporting area. A distance between the center axis X-X of the wafer and the center axis X'-X' of the second supporting area may be within a range of 0 mm-0.1 mm. In some implementations, the protrusion part may be adjacent to the second supporting area and extend toward the lower chamber. In one implementation, the protrusion part may be formed next to the first channel.

In some implementations, the protrusion part includes an inner corner facing towards the center axis X'-X' of the second supporting area. The inner corner may be formed by an inner surface of the protrusion part and an inner surface of the first channel and may face towards the center axis X'-X' of the second supporting area. In one implementation, the inner corner may be configured to resist against an edge area of the wafer. For example, during the course that the upper chamber moves from a first position to a second position, the inner corner of the protrusion part may contact an edge of the wafer, and then may resist against the edge of the wafer, pushing the wafer to move. In some implementations, the inner surface of the protrusion part may contact an edge of the wafer, and then may resist against the edge of the wafer, pushing the wafer to move.

In some implementations or any combination of preceding exemplary implementations of method 600, at step 610, apparatus 200 (or apparatus 300, apparatus 400, or apparatus 500) may inject one or more chemical fluids into a first space for etching an edge area of a wafer. The one or more chemical fluids may flow around an edge of the wafer in a first space and etch the edge area of the wafer accommodated into the first space. In some implementations, the apparatus may comprise a through hole connecting the first space with an outside of the apparatus. The one or more chemical fluids may be injected into the first space via the through hole. In some implementations, the one or more chemical fluids may flow from the first space into the outside of the apparatus via the through hole. In some implementations, the apparatus may comprise two through holes, each of which may respectively connect the first space with the outside of the apparatus. The two through holes may be arranged with a distance away to each other. The one or more chemical fluids may be injected into the first space via one through hole and flow from the first space into the outside of the apparatus via the other through hole.

Certain implementations may be implemented as a computer program product that may include instructions stored on a non-transitory machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, a magnetic storage medium (e.g., floppy diskette), an optical storage medium (e.g., CD-ROM), a magneto-optical storage medium, a read-only memory (ROM), a random-access memory (RAM), an erasable programmable memory (e.g., EPROM and EEPROM), a flash memory, or another type of medium suitable for storing electronic instructions. The machine-readable medium may be referred to as a non-transitory machine-readable medium.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Also, the terms "first," "second," "third," "fourth," etc., as used herein are meant as labels to distinguish among different elements and may not necessarily have an ordinal meaning according to their numerical designation. Therefore, the terminology used herein is for the purpose of describing particular implementations only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations. Described operations may be adjusted so that they occur at slightly different times or the described operations may be distributed in a system. The system allows the occurrence of the processing operations at various intervals associated with the processing.

Many modifications and other implementations of the disclosure set forth herein will come to mind to one skilled in the art to which the disclosure pertains having the benefit of the teachings presented in the foregoing description and the associated figures. Therefore, it is to be understood that the disclosure is not to be limited to the specific implementations disclosed and that modifications and other implementations are intended to be included within the scope of the appended claims. Moreover, although the foregoing description and the associated figures describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A semiconductor processing apparatus, comprising:

a lower chamber having a first supporting area configured to support a wafer;

an upper chamber having a second supporting area, wherein the upper chamber is engaged with the lower chamber to position the wafer between the first supporting area and the second supporting area, wherein a first area of the wafer is engaged with an upper surface of the first supporting area and a lower surface of the second supporting area to fix the wafer between the first supporting area and the second supporting area; and a first channel formed at a peripheral area of the first supporting area or the second supporting area, wherein the first channel is configured to provide a first space to flow one or more chemical fluids to an edge area of the wafer for edge etching, and wherein the edge area is different than the first area of the wafer, wherein the upper chamber comprises a protrusion part being configured to resist against an edge of the wafer in order to align a central axis of the wafer with a central axis of the second supporting area, wherein a first groove is formed at a peripheral area of the lower chamber and configured to provide a first groove space for housing at least a portion of the protrusion part, and wherein a passage is formed between an inner underneath surface of the protrusion part of the upper chamber and an upper surface of the lower chamber, the passage connecting the first space with the first groove space having an inclusive angle relative to the second supporting area for facilitating the one or more chemical fluids flow from the first space to the first groove space via the passage.

2. The semiconductor processing apparatus of claim 1, wherein the first area of the wafter is free from contacting the one or more chemical for etching, and wherein the protrusion part is adjacent to the second supporting area and extends toward the lower chamber, the center axis of the wafer being perpendicular to an upper surface of the wafer, the center axis of the second supporting area being perpendicular to a lower surface of the upper chamber, and the upper surface of the wafer being parallel to the lower surface of the second supporting area.

3. The semiconductor processing apparatus of claim 1, wherein the protrusion part includes a closed loop arranged around the wafer, and the protrusion part is configured to uniformly resist against the edge area of the wafer so that the center axis of the wafer overlaps with the center axis of the second supporting area.

4. The semiconductor processing apparatus of claim 1, wherein the protrusion part includes a plurality of juts being circularly and evenly arranged around the wafer to uniformly resist against the edge area of the wafer.

5. The semiconductor processing apparatus of claim 2, wherein the protrusion part includes an inner surface inclining at an angle to the center axis of the second supporting area, the inner surface being configured to resist against the edge area of the wafer.

6. The semiconductor processing apparatus of claim 2, wherein the protrusion part includes an inner corner facing towards the center axis of the second supporting area, the inner corner being configured to resist against the edge area of the wafer.

7. The semiconductor processing apparatus of claim 1, wherein a second groove is formed at a peripheral area of the upper chamber and positioned above the first groove.

8. The semiconductor processing apparatus of claim 7, wherein an elastic component is placed between the first groove and the second groove, the elastic component being configured to block the one or more chemical fluids from flowing from the first space to the first groove space.

9. The semiconductor processing apparatus of claim 8, wherein the elastic component is O-ring.

10. The semiconductor processing apparatus of claim 1, wherein the first channel is formed at the peripheral area of the second supporting area, and wherein the upper chamber comprises a first through hole configured to facilitate the one or more chemical fluids to flow between the first space and an outside of the apparatus.

11. The semiconductor processing apparatus of claim 10, wherein a second channel is formed at the peripheral area of the first supporting area and configured to provide a second space to flow the one or more chemical fluids for etching the edge area of the wafer.

12. The semiconductor processing apparatus of claim 11, wherein the lower chamber comprises a second through hole configured to facilitate the one or more chemical fluids to flow between the second space and the outside of the apparatus.

13. The semiconductor processing apparatus of claim 1, wherein the first channel is formed at the peripheral area of the first supporting area, and wherein the lower chamber comprises a first through hole configured to facilitate the one or more chemical fluids to flow between the first space and an outside of the apparatus.

14. A semiconductor processing system, comprising:

a semiconductor processing apparatus, comprising:

a lower chamber having a first supporting area configured to support a wafer;

an upper chamber having a second supporting area, wherein the upper chamber is engaged with the lower chamber to place the wafer between the first supporting area and the second supporting area, wherein a first area of the wafer is engaged with an upper surface of the first supporting area and a lower surface of the second supporting area to fix the wafer between the first supporting area and the second supporting area; and a first channel formed at a peripheral area of the first supporting area or the second supporting area, wherein the first channel is configured to provide a first space to flow one or more chemical fluids to an edge area of the wafer for edge etching, and wherein the edge area is different than the first area of the wafer, wherein the upper chamber comprises a protrusion part being configured to resist against an edge of the wafer and to align a center axis of the wafer with a center axis of the second supporting area; and a material storage apparatus connected to the semiconductor processing apparatus, the material storage apparatus being configured to store the one or more chemical fluids and transfer the one or more chemical fluids between the semiconductor processing apparatus and the material storage apparatus, wherein a first groove is formed at a peripheral area of the lower chamber and configured to provide a first groove space for housing at least a portion of the protrusion part; and wherein a passage is formed between an inner underneath surface of the protrusion part of the upper chamber and an upper surface of the lower chamber, the passage connecting the first space with the first groove space having an inclusive angle relative to the second supporting area for facilitating the one or more chemical fluids flow from the first space to the first groove space via the passage.

15. The semiconductor processing system of claim 14, wherein the first area of the wafter is free from contacting the one or more chemical for etching, and wherein:

the protrusion part is adjacent to the second supporting area and extends toward the lower chamber, the center axis of the wafer being perpendicular to an upper surface of the wafer, the center axis of the second supporting area being perpendicular to a lower surface of the upper chamber, and the upper surface of the wafer being parallel to the lower surface of the second supporting area;

the protrusion part includes a closed loop arranged around the edge of the wafer; and the protrusion part is configured to uniformly resist against the edge area of the wafer so that a center axis of the protrusion part overlaps with the center axis of the second supporting area.

16. The semiconductor processing system of claim 14, wherein the protrusion part is adjacent to the second supporting area and extends toward the lower chamber, the center axis of the wafer being perpendicular to an upper surface of the wafer, the center axis of the second supporting area being perpendicular to a lower surface of the upper chamber, and the upper surface of the wafer being parallel to the lower surface of the second supporting area; and the protrusion part includes a plurality of juts being circularly and evenly arranged around the edge of the wafer to uniformly resist against the edge area of the wafer.

17. The system of claim 14, wherein:

a second groove is formed at a peripheral area of the upper chamber and positioned above the first groove, an elastic component being placed between the first groove and the second groove for blocking the one or more chemical fluids from flowing from the first space to the first groove space.

18. A method for processing an edge of semiconductor, comprising:

placing a wafer on a first supporting area of a lower chamber of a semiconductor processing apparatus;

engaging an upper chamber of the semiconductor processing apparatus with the lower chamber to place the wafer between the first supporting area and a second supporting area of the upper chamber, wherein a first area of the wafer is engaged with an upper surface of the first supporting area and a lower surface of the second supporting area to fix the wafer between the first supporting area and the second supporting area;

forming a first channel at a peripheral area of the first supporting area or the second supporting area, wherein the first channel provides a first space;

using a protrusion part to resist against an edge of the wafer and to align a center axis of the wafer with a center axis of the second supporting area, wherein a peripheral area of the lower chamber has a first groove space for housing at least a portion of the protrusion part and there is a passage between an inner underneath surface of the protrusion part of the upper chamber and an upper surface of the lower chamber, the passage connecting the first space with the first groove space having an inclusive angle relative to the second supporting area; and injecting one or more chemical fluids into the first space for etching an edge area of the wafer, wherein the edge area is different than the first area of the wafer, and wherein the one or more chemical fluids flow from the first space to the first groove space via the passage.

* * * * *